United States Patent
Shizuno et al.

(10) Patent No.: US 9,035,463 B2
(45) Date of Patent: May 19, 2015

(54) WIRING BOARD AND METHOD FOR MANUFACTURING THE SAME

(71) Applicant: Ibiden Co., Ltd., Ogaki-shi (JP)

(72) Inventors: Yoshinori Shizuno, Gifu (JP); Nobuya Takahashi, Gifu (JP); Hisayuki Nakagome, Gifu (JP); Asuka Ii, Gifu (JP)

(73) Assignee: IBIDEN CO., LTD., Ogaki-shi (JP)

( * ) Notice: Subject to any disclaimer, the term of this patent is extended or adjusted under 35 U.S.C. 154(b) by 150 days.

(21) Appl. No.: 13/895,834

(22) Filed: May 16, 2013

(65) Prior Publication Data

US 2013/0307162 A1 Nov. 21, 2013

(30) Foreign Application Priority Data

May 18, 2012 (JP) ................. 2012-115103

(51) Int. Cl.
*H01L 23/498* (2006.01)
*H01L 21/768* (2006.01)
*H01L 25/18* (2006.01)
*H01L 23/13* (2006.01)
*H01L 21/56* (2006.01)
*H05K 1/11* (2006.01)
*H05K 3/46* (2006.01)

(52) U.S. Cl.
CPC .... *H01L 23/49827* (2013.01); *H01L 21/76802* (2013.01); *H01L 23/49816* (2013.01); *H01L 23/49822* (2013.01); *H01L 25/18* (2013.01); *H01L 23/13* (2013.01); *H01L 21/563* (2013.01); *H01L 2224/32225* (2013.01); *H01L 2224/73204* (2013.01); *H01L 2924/15311* (2013.01); *H01L 2924/15192* (2013.01); *H05K 1/11* (2013.01); *H05K 3/4602* (2013.01); *H05K 3/4644* (2013.01); *H01L 2224/131* (2013.01); *H01L 2224/16237* (2013.01); *H01L 2224/81192* (2013.01); *H05K 2201/10522* (2013.01)

(58) Field of Classification Search
USPC ........................................ 257/774; 438/667
See application file for complete search history.

(56) References Cited

U.S. PATENT DOCUMENTS 7,224,046 B2 * 5/2007 Abe et al. .................. 257/668
7,462,784 B2 12/2008 Kariya et al.

FOREIGN PATENT DOCUMENTS

WO 2007/129545 11/2007

* cited by examiner

*Primary Examiner* — Roy Potter
(74) *Attorney, Agent, or Firm* — Oblon, McClelland, Maier & Neustadt, L.L.P.

(57) ABSTRACT

A wiring board includes a first insulation layer, a first conducive layer having first conductive patterns formed on the first insulation layer, a wiring structure positioned on the first insulation layer and including a second insulation layer and a second conductive layer having second conductive patterns formed on the second insulation layer, multiple conductive patterns formed on the wiring structures such that the conductive patterns are connected to the second conductive patterns, respectively, multiple first electrodes formed on the first conductive patterns, respectively, and multiple second electrodes formed on the conductive patterns connected to the second conductive patterns of the wiring structure, respectively. The first electrodes and the second electrodes have top surfaces which form the same plane.

16 Claims, 26 Drawing Sheets

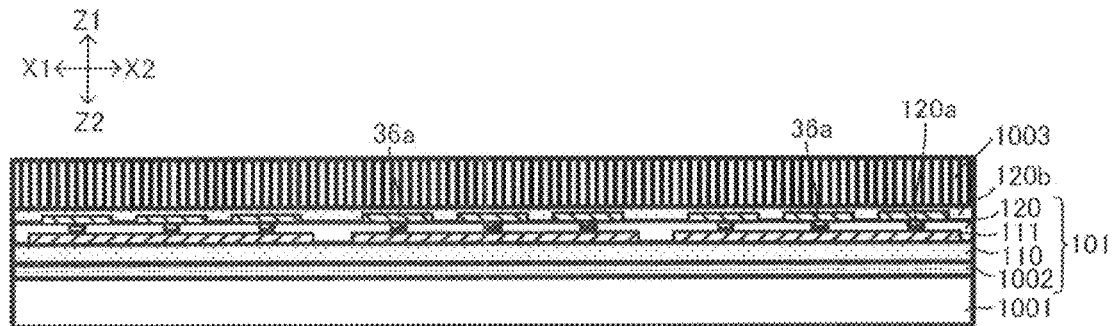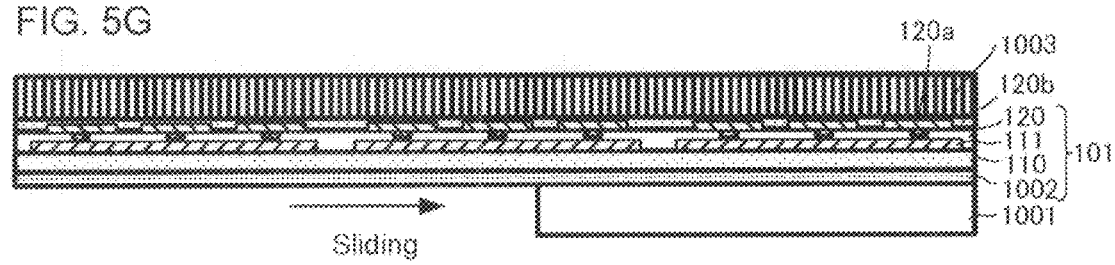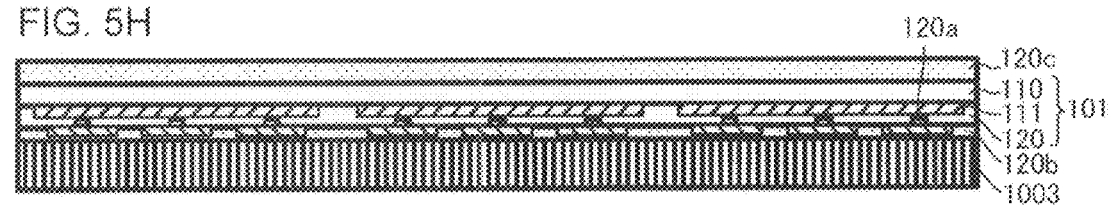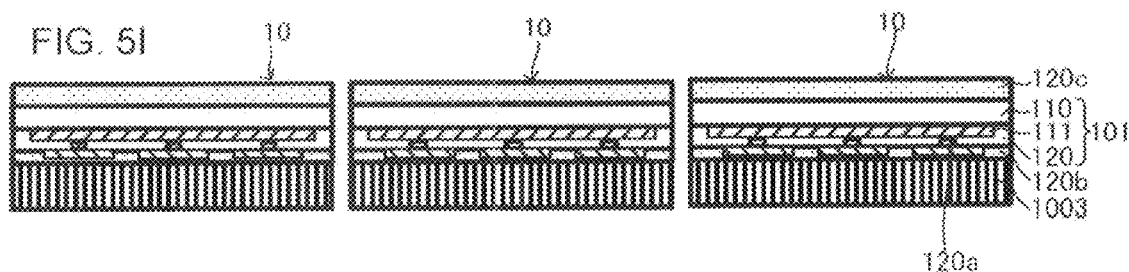

WIRING BOARD AND METHOD FOR MANUFACTURING THE SAME

CROSS-REFERENCE TO RELATED APPLICATIONS

The present application is based upon and claims the benefit of priority to Japanese Patent Application No. 2012-115103, filed May 18, 2012, the entire contents of which are incorporated herein by reference.

BACKGROUND OF THE INVENTION

1. Field of the Invention

The present invention relates to a wiring board and its manufacturing method, more specifically, to a wiring board having a high-density wiring section and a method for manufacturing such a wiring board.

2. Description of Background Art

As a multilayer printed wiring board for mounting an IC chip (semiconductor element), a type of wiring board has interlayer resin insulation layers and conductive layers are alternately laminated on a resin core substrate having through-hole conductors, and the conductive layers are connected by via-hole conductors.

IC chips have become finer and more highly integrated recently, and the number of pads formed on the uppermost layer of a packaging substrate is increasing, leading to further fine-pitched pads. Following such pads with finer pitches, the wiring pitches of a packaging substrate are also rapidly becoming narrower (see International Publication No. 2007/129545, for example).

High-density wiring is formed in part of such a wiring board. An electronic component is incorporated in interlayer resin insulation layers of the wiring board; and the electronic component is formed by arranging a high-density wiring layer on a substrate made of heat-resistant material such as silicon and glass with a low thermal expansion coefficient. The entire contents of this publication (these publications) are incorporated herein by reference.

SUMMARY OF THE INVENTION

According to one aspect of the present invention, a wiring board includes a first insulation layer, a first conducive layer having first conductive patterns formed on the first insulation layer, a wiring structure positioned on the first insulation layer and including a second insulation layer and a second conductive layer having second conductive patterns formed on the second insulation layer, multiple conductive patterns formed on the wiring structures such that the conductive patterns are connected to the second conductive patterns, respectively, multiple first electrodes formed on the first conductive patterns, respectively, and multiple second electrodes formed on the conductive patterns connected to the second conductive patterns of the wiring structure, respectively. The first electrodes and the second electrodes have top surfaces which form the same plane.

According to another aspect of the present invention, a method for manufacturing a wiring board includes forming a first conductive layer having first conductive patterns on a first insulation layer, positioning on the first insulation layer a wiring structure including a second insulation layer and a second conductive layer having second conductive patterns formed on the second insulation layer, forming multiple conductive patterns on the second conductive patterns such that the conductive patterns are connected to the second conductive patterns, respectively, forming multiple first electrodes on the first conductive patterns, respectively, and forming multiple second electrodes on the conductive patterns connected to the second conductive patterns of the wiring structure, respectively. The first electrodes and the second electrodes are formed such that the first electrodes and the second electrodes have top surfaces which form the same plane.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5F is a view of a step illustrating a method for manufacturing a wiring structure shown in FIG. 4;

FIG. 5G is a view of a step illustrating a method for manufacturing a wiring structure shown in FIG. 4;

FIG. 5H is a view of a step illustrating a method for manufacturing a wiring structure shown in FIG. 4;

FIG. 5I is a view of a step illustrating a method for manufacturing a wiring structure shown in FIG. 4;

DETAILED DESCRIPTION OF THE EMBODIMENTS

Figure 1A:
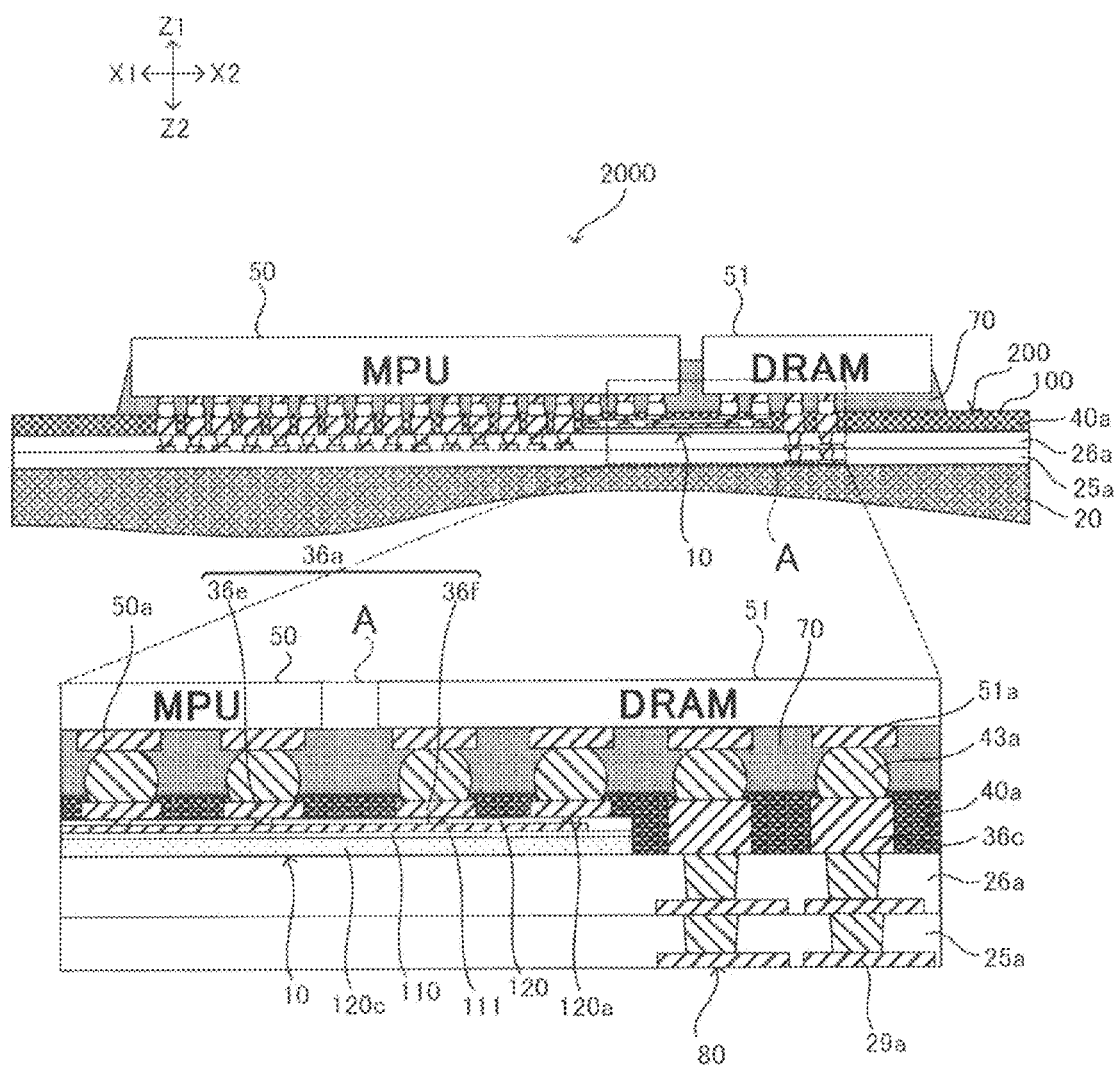
FIG. 1A is a cross-sectional view of a package substrate in which a wiring board according to a first embodiment of the present invention is used (the lower view shows an enlarged cross section of region (A), which is a main part of the upper view)

The embodiments will now be described with reference to the accompanying drawings, wherein like reference numerals designate corresponding or identical elements throughout the various drawings.

Arrows (Z1, Z2) each indicate a lamination direction (or a thickness direction of a wiring board) corresponding to a direction along a normal line to main surfaces (upper and lower surfaces) of the wiring board. On the other hand, arrows (X1, X2) and (Y1, Y2) each indicate a direction perpendicular to a lamination direction (or a direction toward a side of each layer). The main surfaces of a wiring board are on the X-Y plane. Side surfaces of a wiring board are on the X-Z plane or the Y-Z plane. In a lamination direction, a side closer to the core of a wiring board is referred to as a lower layer, and a side farther from the core as an upper layer.

In the embodiments below, conductive layers are such layers that include one or multiple conductive patterns. Conductive layers may include conductive patterns that form electric circuits such as wiring (ground included), pads, lands and the like, or they may include a planar conductive pattern that does not form electric circuits.

Opening portions include notches and slits in addition to holes and grooves.

Among the conductors formed in opening portions, the conductor formed in a via hole is referred to as a via conductor, the conductor formed in a through hole as a through-hole conductor, and the conductor filled in an opening portion as a filled conductor.

A land is a conductor formed on top of or on the periphery of a hole (via hole, through hole or the like), at least part of which is formed to be contiguous with the conductor inside the hole (via conductor, through-hole conductor or the like).

Stacking means a via conductor is formed on the land of a via conductor formed in its lower layer. Namely, unless the bottom surface of a via conductor is positioned off the land of a via conductor formed in its lower layer, they are stacked.

Plating includes wet plating such as electrolytic plating and electroless plating as well as dry plating such as PVD (physical vapor deposition) and CVD (chemical vapor deposition).

For interlayer materials, interlayer insulation film (brand name: ABF-GX13, made by Ajinomoto) is used.

Unless otherwise specified, the "width" of a hole or a column (protrusion) indicates the diameter if it is a circle, and $2\sqrt{}$ (cross section/$\pi$) if it is other than a circle. However, measurements are not limited to such if they are clearly indicated otherwise. Also, when measurements are not uniform (with irregularities or tapering), basically, the average value of measurements is used (average excluding abnormal values). However, that is not the only option when it is clearly stated to use values such as the maximum value other than the average values.

First Embodiment

Figure 1B:
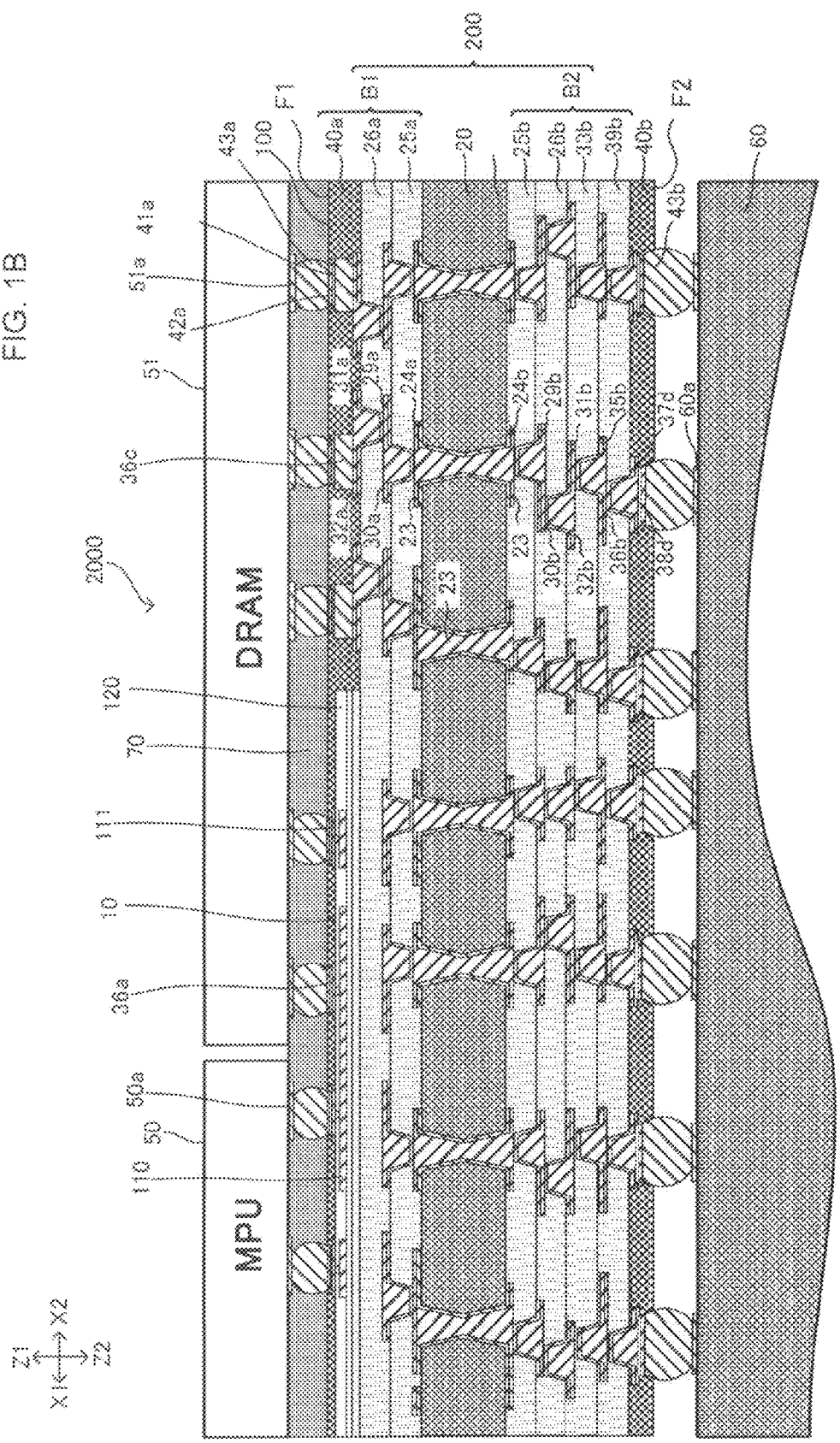
FIG. 1B is a cross-sectional view showing the details of a package substrate in which a wiring board of the first embodiment is used.

Wiring board 100 according to the present embodiment is a multilayer printed wiring board as shown in FIGS. 1A and 1B, for example. Wiring board 100 of the present embodiment is a buildup multilayer wiring board with a core substrate. However, a wiring board related to the present invention is not limited to a buildup multilayer wiring board with a core substrate; for example, it may be a coreless wiring board that does not include a core substrate. In addition, in wiring board 100, the measurements of conductive layers and insulation layers, the number of layers and the like may be modified freely within a scope of the technical concept of the present invention.

Figure 2:
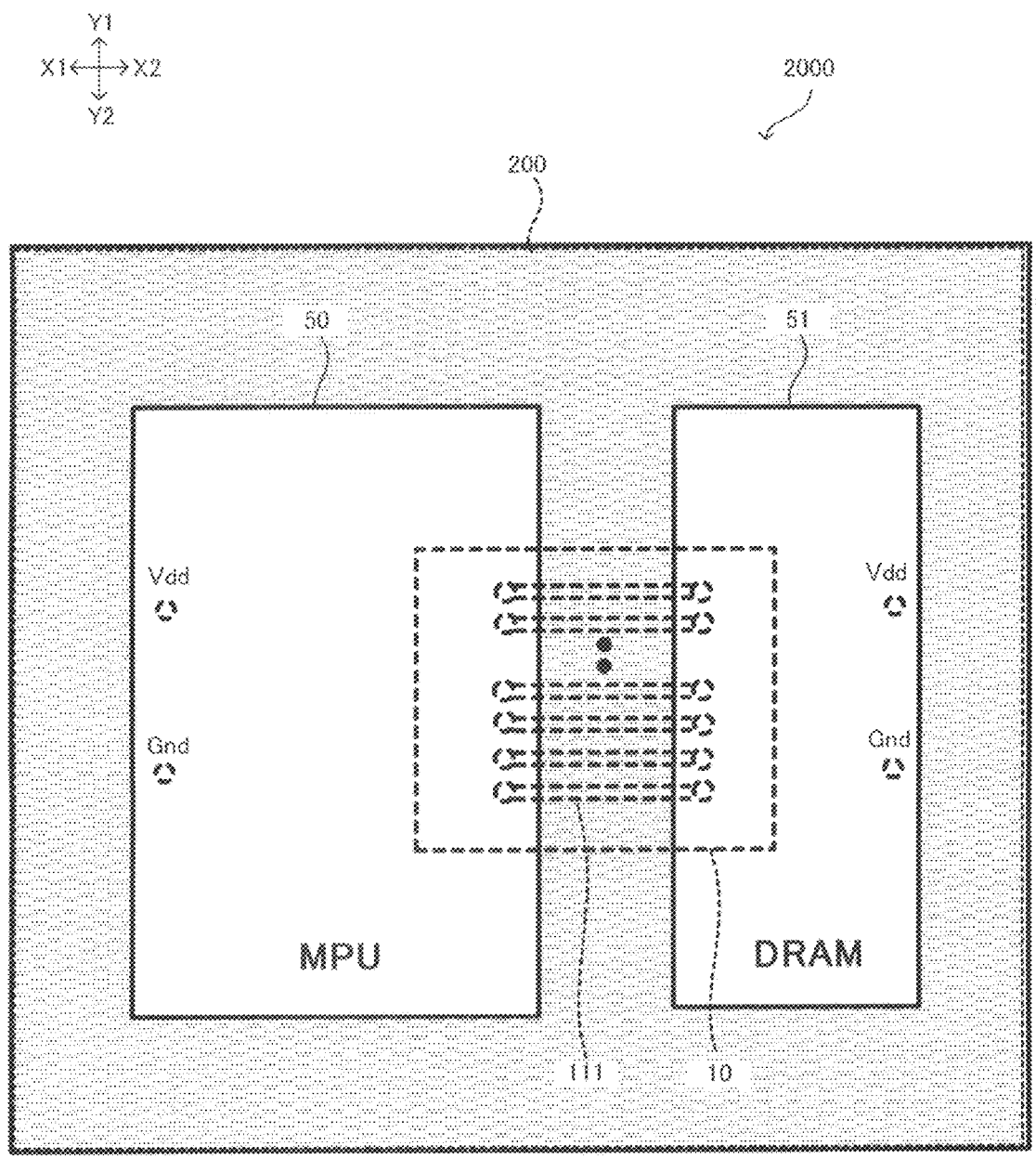
FIG. 2 is a plan view of FIG. 1A seen from direction (Z2)

As shown in FIGS. 1A, 1B and 2, MPU (Micro-Processing Unit) 50 as a first semiconductor element and DRAM (Dynamic Random Access Memory) 51 as a second semiconductor element are mounted on wiring board 100 to form package board 2000. As shown in FIG. 1B, wiring board 100 is mounted on motherboard 60. Spaces among wiring board 100, MPU 50 and DRAM 51 are encapsulated by underfill resin 70.

Wiring board 100 has core substrate 20, interlayer resin insulation layers (25*a*, 26*a*, 25*b*, 26*b*, 33*b*, 39*b*), conductive layers (24*a*, 29*a*, 31*a*, 24*b*, 29*b*, 31*b*, 35*b*, 37 *d*), via conductors (23, 30*a*, 32*a*, 30*b*, 32*b*, 36*b*, 38*d*) and solder-resist layers (40*a*, 40*b*) formed on the uppermost surface layers.

Core substrate 20 has first surface (F1) (Z1 side) and its opposing second surface (F2) (Z2 side), and via conductors 23 penetrate through core substrate 20. Core substrate 20, via conductors 23, and conductive layers (24*a*, 24*b*) make up the core section. In addition, buildup section (B1) (first laminated section) is formed on first surface (F1) of core substrate 20, and buildup section (B2) (second laminated section) is formed on second surface (F2) of core substrate 20. Buildup section (B1) includes two pairs of interlayer resin insulation layers and conductive layers (interlayer resin insulation layers (25*a*, 26*a*) and conductive layers (24*a*, 29*a*, 31*a*)), and buildup section (B2) includes four pairs of interlayer resin insulation layers and conductive layers (interlayer resin insulation layers (25*b*, 26*b*, 33*b*, 39*b*) and conductive layers (24*b*, 29*b*, 31*b*, 35*b*, 37*d*)). Alternatively, buildup section (B2) may have two pairs of interlayer resin insulation layers and conductive layers (interlayer resin insulation layers (25*b*, 26*b*) and conductive layers (24*b*, 29*b*, 31*b*).

On the first-surface (F1) side of core substrate 20, three conductive layers (24*a*, 29*a*, 31*a*) and two interlayer resin insulation layers (25*a*, 26*a*) are alternately laminated from the lower side (Z2 side). Interlayer resin insulation layers (25*a*, 26*a*) are formed between their respective conductive layers (24*a*, 29*a*, 31*a*). In addition, solder-resist layer (40*a*) is positioned on the uppermost surface of the first-surface (F1) side of core substrate 20.

On the second-surface (F2) side of core substrate 20, five conductive layers (24*b*, 29*b*, 31*b*, 35*b*, 37*d*) and four interlayer resin insulation layers (25*b*, 26*b*, 33*b*, 39*b*) are alternately laminated. Interlayer resin insulation layers (25*b*, 26*b*, 33*b*, 39*b*) are formed between their respective conductive layers (24*b*, 29*b*, 31*b*, 35*b*, 37*d*). In addition, solder-resist layer (40*b*) is positioned on the uppermost surface of the second-surface (F2) side of core substrate 20.

Penetrating holes 21 that penetrate through core substrate 20 (see FIG. 7B) are formed in core substrate 20. Via conductors 23 are filled conductors, and are formed by filling penetrating holes with conductor such as metal. Conductive layer (24*a*) formed on first surface (F1) of core substrate 20 and conductive layer (24*b*) formed on second surface (F2) of core substrate 20 are electrically connected to each other by via conductor 23.

Core substrate 20 is made by impregnating a core material with resin, for example. Core substrate 20 is obtained by impregnating fiberglass cloth with epoxy resin, performing thermosetting treatment, and further shaping it into a sheet, for example. However, that is not the only option, and the material for core substrate 20 may be selected freely.

Via conductor 23 is shaped like an hourglass with a diameter that decreases from first surface (F1) and second surface (F2) of core substrate 20 toward its central portion, for example. Also, the planar shape of via conductor 23 (X-Y plane) is a perfect circle, for example. However, those are not the only options, and via conductor 23 may be in any other shape.

Via conductors (30*a*, 32*a*, 30*b*, 32*b*, 36*b*, 38*d*) are formed in their respective interlayer resin insulation layers (25*a*, 26*a*, 25*b*, 26*b*, 33*b*, 39*b*). Those via conductors are each a filled conductor, and are formed by filling via conductors penetrating through their respective interlayer resin insulation layers. Via conductors (30*a*, 32*a*, 30*b*, 32*b*, 36*b*, 38*d*) are shaped in a tapered column (truncated cone), for example, with a diameter that decreases toward core substrate 20, and their planar shape (X-Y plane) is a perfect circle, for example. However, those are not the only options, and via conductors (30*a*) and others may be in any other shape. In addition, on interlayer resin insulation layer (26*a*), electrodes (36*c*) are formed to be covered by solder-resist layer (40*a*).

Interlayer resin insulation layer (25*a*) (the lowermost interlayer resin insulation layer of the first laminated section), interlayer resin insulation layer (25*b*) (the lowermost interlayer resin insulation layer of the second laminated section), and their respective upper interlayer resin insulation layers (26*a*, 26*b*, 33*b*, 39*b*) are each made of epoxy resin, and include a component that dissolves easily in a later-described roughening solution as well as another component that does not easily dissolve in that solution. However, the material for each insulation layer is not limited to such, and any other material may be used.

Solder bumps (43*a*) are positioned on the uppermost layer of wiring board 100, and solder bumps (43*a*) are electrically connected to MPU 50 and DRAM 51 through pads (50*a*, 51*a*).

In the present embodiment, wiring board 100 includes main wiring board 200 and wiring structure (sub wiring board) 10 incorporated in main wiring board 200. Wiring structure 10 is designed according to wiring rules for semiconductor elements such as IC and LSI as described in detail later, not according to wiring rules for multilayer printed wiring boards, and is designed to have a finer L/S (line/space), the ratio of line to space, which is an index of wiring density. Here, line means pattern widths, and space means the space between patterns, which is the distance between the centers of patterns. Specifically, wiring structure 10 is formed to have high-density wiring with an L/S ratio of line to space at 1 µm/1 µm~5 µm/5 µm, preferably 3 µm/3 µm~5 µm/5 µm. Such ratios are very fine compared with L/S ratios at approximately 10 µm/10 µm of regular multilayer printed wiring boards such as main wiring board 200 of the present embodiment. Therefore, the distance between adjacent conductive layers (36*a*) is smaller than the distance between adjacent electrodes (36*c*).

Main wiring board 200 includes signal transmission lines and power lines to supply power to terminals (Vdd) of semiconductor elements MPU 50 and DRAM 51 (see FIG. 2).

Adhesive layer (120*c*) is interposed between interlayer resin insulation layer (26*a*) (first resin insulation layer) and wiring structure 10 (see FIG. 1A). Wiring structure 10 is fixed to interlayer resin insulation layer (26*a*) by adhesive layer (120*c*) while being covered by solder-resist layer (40*a*).

Wiring structure 10 has insulation layer 110, conductive patterns 111 formed on insulation layer 110, insulation layer 120 formed to cover conductive patterns 111, and via conductors (120*a*) formed in insulation layer 120 and connecting upper and lower conductive patterns.

Any of polyimide, phenolic resin and polybenzoxazole-based resin may be used for insulation layers (110, 120). In addition, conductive layer (36*a*) formed on wiring structure 10 is set to be positioned on the same plane as electrode (36*c*) formed on interlayer resin insulation layer (26*a*).

Wiring structure 10 does not include power-supply lines; it includes only signal transmission lines and is used to transmit signals between MPU 50 and DRAM 51.

Specifically, conductive patterns 111 are used for signal transmission between MPU 50 and DRAM 51, but are not used for power supply to MPU 50 and DRAM 51. Power terminals (Vdd) of MPU 50 and DRAM 51 are electrically connected to stacked vias 80 in main wiring board 200 (see FIG. 3) so that power is supplied from an outside DC power source. Ground terminals (Gnd) (see FIG. 2) of MPU 50 and DRAM 51 are connected to ground through other stacked vias in main wiring board 200.

As the material for adhesive layer (120c), epoxy-based, acrylic, or silicone-based adhesives may be used, for example. Small-diameter holes to form via conductors (120a) are formed in insulation layer 120. Such holes are filled with conductors to form filled via conductors (120a).

Via conductors (120a) are electrically connected to upper-layer conductive pads (36a). Conductive pads (36a) are electrically connected to MPU 50 and DRAM 51 through upper solder bumps (43a) and conductive pads (50a, 51a).

In wiring board 100 of the present embodiment, insulation layer 110 is formed between conductive pattern 111 and adhesive layer (120c). Namely, wiring structure 10 is triple-layered. However, that is not the only option, and wiring structure 10 may be formed without insulation layer 110 so as to be double-layered where conductive patterns 111 are formed directly on adhesive layer (120c). Also, referring to FIG. 1A, among conductive pads (36a) connected to conductive patterns 111 of wiring structure 10, the distance between conductive pads (36e) (first pads) connected to MPU 50 is set smaller than the distance between conductive pads (36f) (second pads) connected to DRAM 51. Also, the distance between adjacent conductive patterns 111 is set smaller than the distance between adjacent conductive layers (31a).

The diameter of via conductors (120a) is preferred to be 1 μm or greater but 10 μm or smaller, more preferably, 0.5 μm or greater but 5 μm or smaller. By setting the diameter of via conductors (120a) at such a fine size, design freedom for wiring distribution of conductive patterns 111 increases in wiring structure 10. For example, using conductive patterns 111 formed only in single insulation layer 120, more wiring lines are distributed from either the right or left side of wiring structure 10. Besides, since conductive patterns 111 are formed only on one layer, the total number of wiring layers decreases in wiring structure 10.

Figure 3:
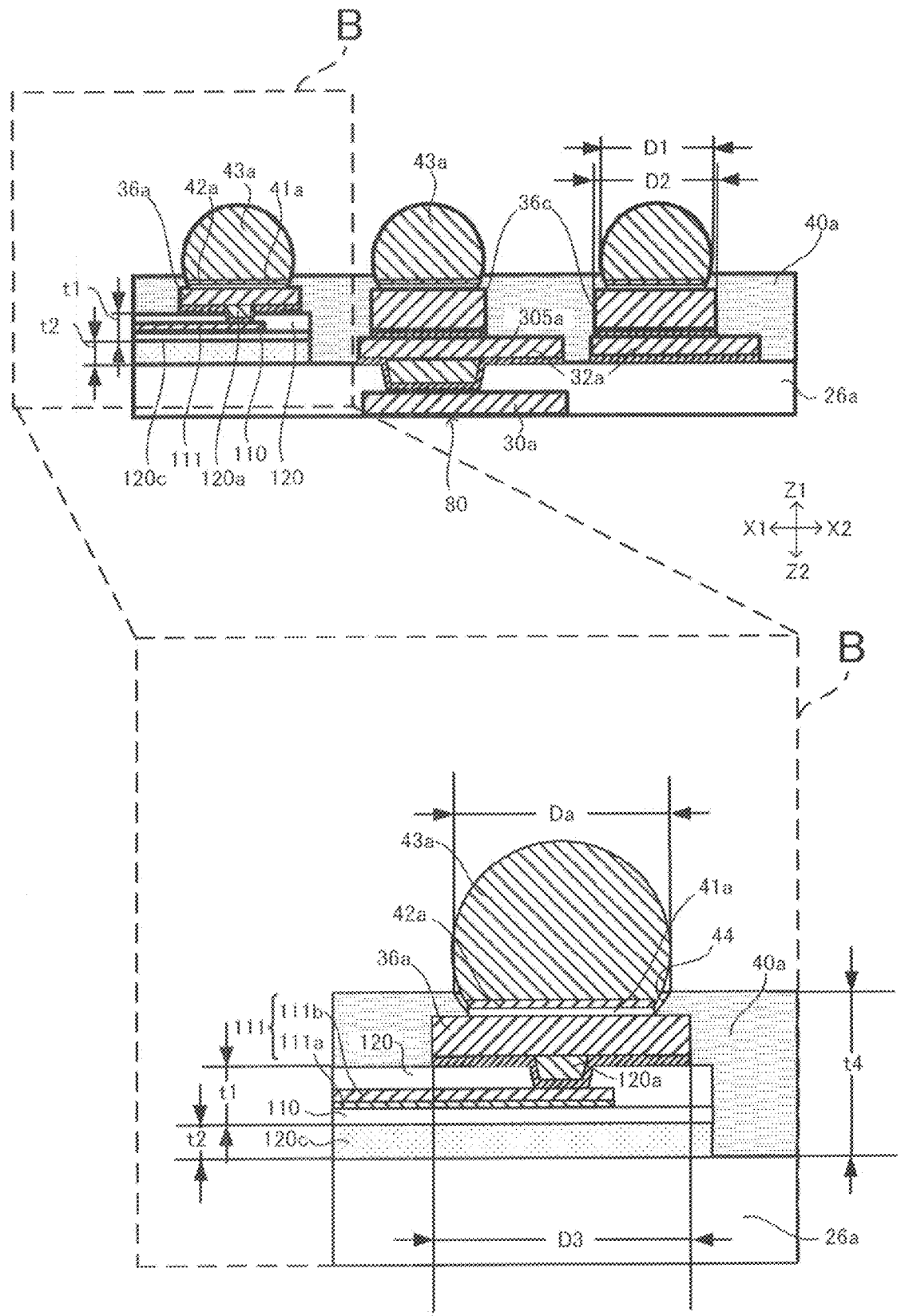
FIG. 3 is a enlarged cross-sectional view of part of FIGS. 1A and 1B, showing a main part of a wiring board of the first embodiment (the lower view shows an enlarged cross section of region (B), which is a main part of the upper view)

As shown in FIG. 3, via conductor (32a) is formed in a via hole of interlayer resin insulation layer (26a) through metal layer (305a) made of metal foil such as copper foil, electroless copper-plated film and electrolytic copper-plated film.

Regarding the measurements of via conductors and others shown in FIG. 3, top-surface diameter (width) (D2) of electrode (36c) is 62 μm, for example, and diameter (D1) of solder bump (43a) is 46 μm, for example. In addition, thickness (t1) of the insulation layer of wiring structure 10 is 25 μm, for example, thickness (t2) of adhesive layer (120c) of wiring structure 10 is 10 μm, for example, and thickness (t4) of solder-resist layer (40a) is 15 μm, for example. By setting thickness (t2) of adhesive layer (120c) of wiring structure 10 to be approximately 10 μm, sufficient adhesive force is obtained with main wiring board 200, leaving a wide selection of material for adhesive layer (120c). In addition, diameter (D3) of conductive layer (36a) on wiring structure 10 is 15~25 μm.

Solder bumps (43a) are positioned on conductive layers (36a) in opening portions (SRO) 44 of solder-resist layers (40a, 40b). Nickel-plated layer (41a) and gold-plated layer (42a) are formed between solder bump (43a) and conductive layer (36a). When diameter (Da) of opening portions 44 of solder-resist layers (40a, 40b) is greater, usually the tolerances are tight during the manufacturing process. However, since the diameter of via conductors (120a) is set to be fine at 1 μm or greater but 10 μm or less in wiring structure 10, even when wiring structure 10 is shifted when mounted on main wiring board 200, there is an advantage in having wide latitude to achieve secure electrical connection.

In the present embodiment, no through hole is formed in wiring board 100 to penetrate through all the layers of main wiring board 200. However, that is not the only option. By forming through holes penetrating through all the layers of main wiring board 200 and by electrically connecting conductive layers on the surface layers to each other, such through holes are used for signal transmission and power supply to a semiconductor element on wiring board 100.

In the present embodiment, all via conductors (30a, 32a, 30b, 32b, 36b, 38d) formed in core substrate 20 have substantially the same size as each other. By so setting, it is easier to set uniform electrical characteristics and manufacturing conditions.

According to wiring board 100 of the present embodiment, main wiring board 200 incorporates wiring structure 10, which has higher wiring density than main wiring board 200 and is used for signal transmission between semiconductor elements. Thus, design freedom is enhanced for wiring board 100 (a multilayer printed wiring board). For example, concentration of all the power and signal wiring lines onto a specific section of a wiring board can be avoided. Also to be avoided are structures where only resin, but no conductor, exists in the region surrounding an electronic component.

The following is a description of an example of the method for manufacturing wiring board 100 according to the present embodiment. The process for manufacturing wiring board 100 is made up of the process for manufacturing wiring structure 10 and the process for manufacturing main wiring board 200, which includes steps for mounting wiring structure 10 in main wiring board 200. Wiring structure 10 is manufactured by the process shown in FIG. 4, for example.

Process for Manufacturing Wiring Structure 10

Figure 4:
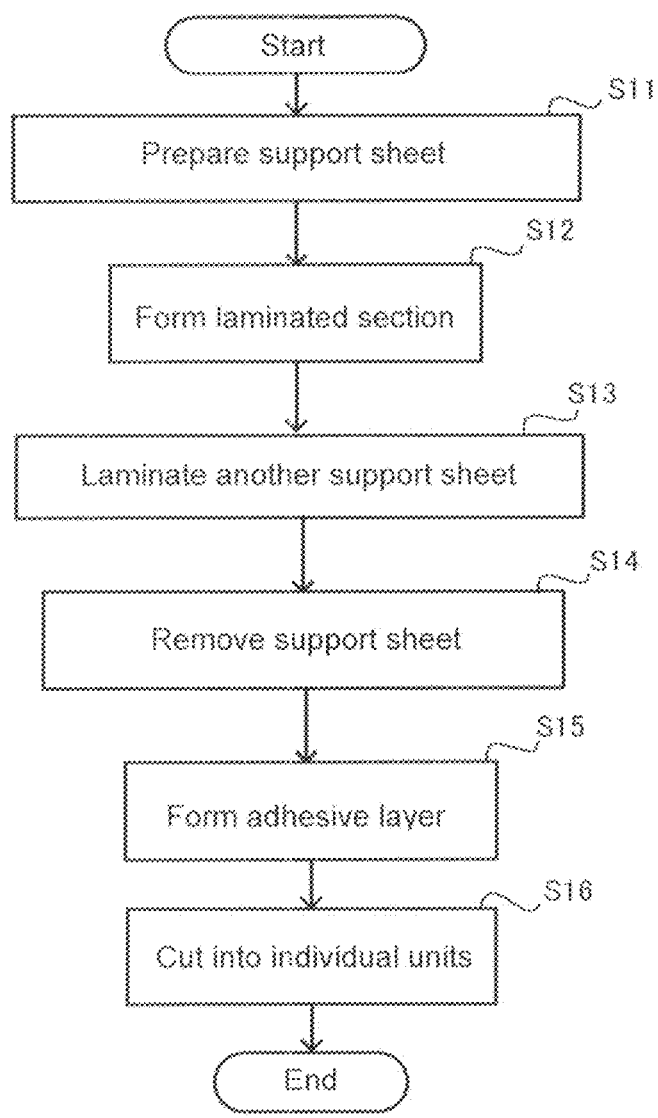
FIG. 4 is a flowchart showing a method for manufacturing a wiring structure according to the first embodiment.
Figure 5A:
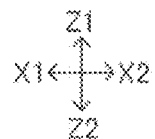
FIG. 5A is a view of a step illustrating a method for manufacturing a wiring structure shown in FIG. 4.
Figure 5A:

In step (S11) of FIG. 4, support sheet 1001 is prepared as shown in FIG. 5A. Support sheet 1001 is glass with a flat surface, for example. Then, adhesive layer 1002 is formed on support sheet 1001.

In step (S12) of FIG. 4, a laminated section is formed on support sheet 1001 with adhesive layer 1002 in between. The laminated section is formed by alternately laminating a resin insulation layer and a conductive pattern (conductive layer).

Figure 5B:
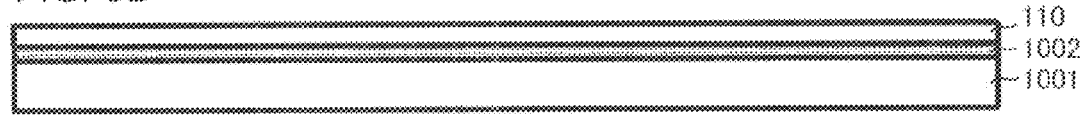
FIG. 5B is a view of a step illustrating a method for manufacturing a wiring structure shown in FIG. 4.
Figure 5C:
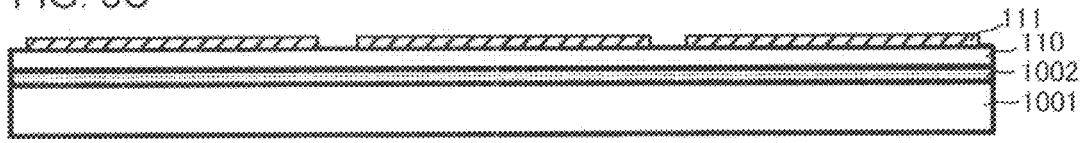
FIG. 5C is a view of a step illustrating a method for manufacturing a wiring structure shown in FIG. 4.

Specifically, insulation layer 110 made of resin (resin insulation layer), for example, is positioned on adhesive layer 1002 as shown in FIG. 5B. Insulation layer 110 and adhesive layer 1002 are adhered through thermal treatment, for example.

As shown in FIG. 5B, conductive patterns 111 are formed on insulation layer 110 using a semi-additive (SAP) method, for example. Conductive pattern 111 is made up of first conductive film (111a) and second conductive film (111b) (see FIG. 3). More specifically, first conductive film (111a) is triple-layered with a TiN layer (lower layer), a Ti layer (middle layer) and a Cu layer (upper layer). Since those metal layers are each formed by sputtering, for example, excellent adhesiveness is secured between fine conductive pattern 111 and base material. Also, second conductive film (111b) is made of electroless copper-plated film on the Cu layer and electrolytic plated film on the electroless copper-plated film.

Conductive patterns 111 are formed to be high density with an L/S (line/space) ratio of line to space at 1 μm/1 μm~5 μm/5 μm, preferably 3 μm/3 μm~5 μm/5 μm. A line means pattern width, and a space is the space between patterns, which is the distance between the centers of pattern widths. The wiring density here is designed using the same design rules as those for forming semiconductor elements such as ICs (integrated circuits) or LSIs (large scale integrated circuits).

Figure 5D:
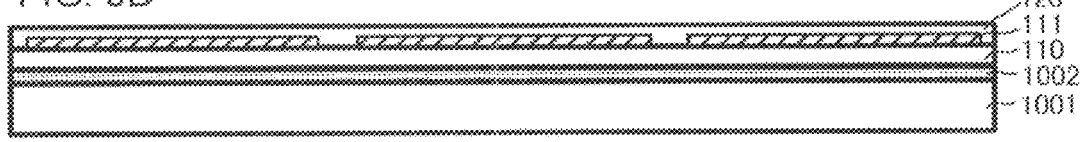
FIG. 5D is a view of a step illustrating a method for manufacturing a wiring structure shown in FIG. 4.

As shown in FIG. 5D, insulation layer 120 is formed on insulation layer 110 by lamination, for example. Insulation layer 120 is formed to cover conductive patterns 111.

Using a laser, for example, holes (via holes) for forming via conductors (120a) are formed in insulation layer 120. Holes reach and expose portions of conductive patterns 111. The diameter of the holes is set to be a fine size of 1 μm or greater but 10 μm or smaller, more preferably 0.5 μm or greater but 5 μm or smaller. Then, desmearing and soft etching are conducted as needed.

Using a semiadditive (SAP) method, for example, via conductors (120a) are formed in the holes (filled conductors). Conductive patterns 121 and via conductors (120a) are each double-layered with first conductive film (121a) and second conductive film (121b) (see FIG. 3). More specifically, first conductive film (121a) is triple-layered with a TiN layer (lower layer), a Ti layer (middle layer) and a Cu layer (upper layer). In addition, second conductive film (121b) is made of electroless copper-plated film on the Cu layer and electrolytic plated film on the electroless copper-plated film.

Figure 5E:
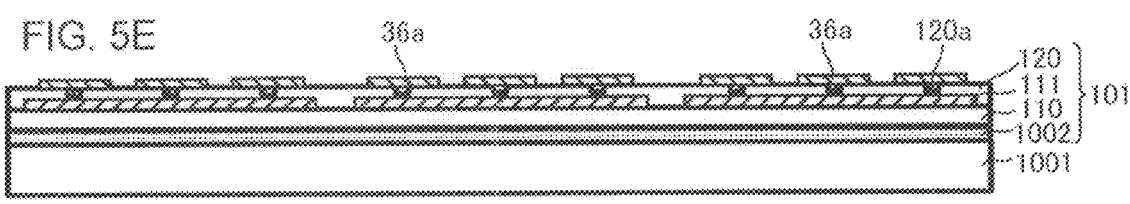
FIG. 5E is a view of a step illustrating a method for manufacturing a wiring structure shown in FIG. 4.

Accordingly, as shown in FIG. 5E, laminated section 101 is formed on support sheet 1001, having insulation layers (110, 120) and conductive patterns 111 where via conductors (120a) are formed on insulation layer 120.

In step (S13) of FIG. 4, another support sheet 1003 is prepared as shown in FIG. 5F. Support sheet 1003 is made of glass with a flat surface, for example, the same as support sheet 1001. Then, support sheet 1003 is laminated on laminated section 101 through adhesive layer (120b).

In step (S14) of FIG. 4, support sheet 1001 is removed. Specifically, for example, after adhesive layer 1002 is softened by laser irradiation, support sheet 1001 slides in direction X (or direction Y) as shown in FIG. 5G, and support sheet 1001 is removed from a second main surface of laminated section 101. If adhesive layer 1002 remains on the second surface of laminated section 101 after support sheet 1001 has been removed from laminated section 101, such adhesive layer 1002 is removed by cleansing. In doing so, laminated section 101 is formed on support sheet 1003 as shown in FIG. 5H. Support sheet 1001 may be used again by cleansing it, for example.

In step (S15) of FIG. 4, adhesive layer (120c) is formed on laminated section 101. Specifically, adhesive layer (120c) is formed on laminated section 101 by applying an adhesive using a laminator to make uniform thickness.

In step (S16) of FIG. 4, using a dicing saw, for example, wiring board 100 is divided into individual units by cutting along predetermined dicing lines as shown in FIG 5I. Accordingly, multiple wiring structures (second wiring boards) 10 are obtained. In wiring structure 10 at this stage, laminated section 101 is formed on support sheet 1003 with adhesive layer (120b) placed in between, and adhesive layer (120c) is further formed on laminated section 101.

The method for manufacturing wiring structure 10 of the present embodiment is suitable for manufacturing wiring structure 10, since a glass sheet with a flat surface is used for support sheets (1001, 1003). Using such a manufacturing method, wiring board 100 is made to be of high quality having flat surfaces and suppressed warping.

Main wiring board 200 is manufactured, while wiring structure 10 is mounted on main wiring board 200 to obtain wiring board 100 of the present embodiment. Wiring board 100 is manufactured by a process shown in FIG. 6, for example.

Process for Manufacturing Wiring Board 100

Figure 6:
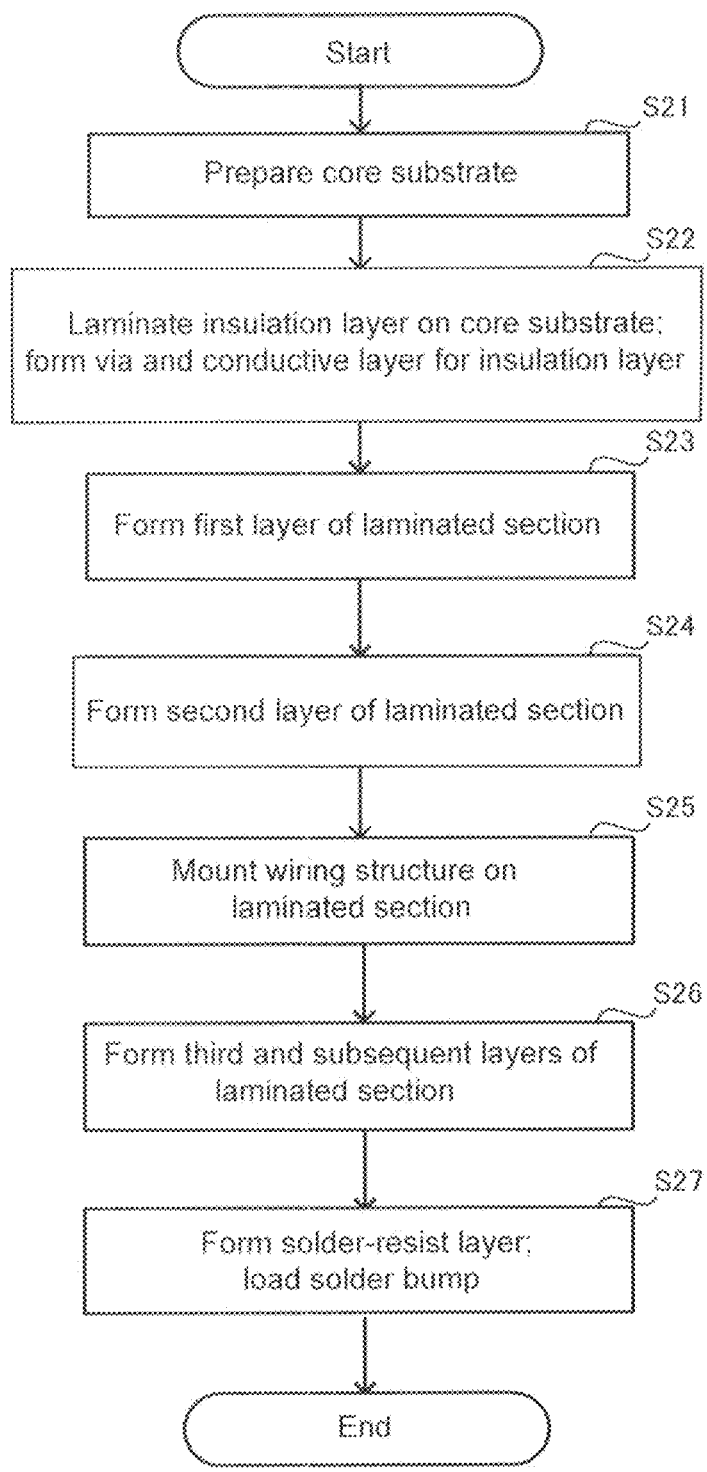
FIG. 6 is a flowchart showing a method for manufacturing a wiring board according to the first embodiment.
Figure 7A:
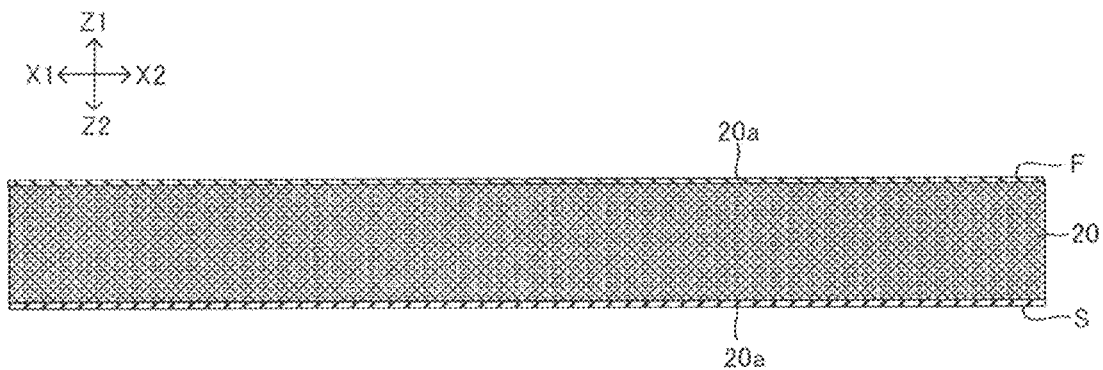
FIG. 7A is a view of a step illustrating a method for manufacturing a wiring board shown in FIG. 6.

First, in step (S21) of FIG. 6, core substrate 20 made by impregnating reinforcing material with resin is prepared as shown in FIG. 7A. Copper foil (20a) is laminated on first surface (F) and second surface (S) of core substrate 20. The thickness of core substrate 20 is 0.4~0.7 mm, for example. As for reinforcing material, glass cloth, aramid fabric, glass fabric or the like is used, for example. As for resin, epoxy resin, BT (bismaleimide triazine) resin or the like is used, for example. Moreover, resin contains hydroxide particles. As for hydroxide, metal hydroxides such as aluminum hydroxide, magnesium hydroxide, calcium hydroxide, barium hydroxide and the like are listed. Since hydroxide decomposes on heating to produce water, it is thought that hydroxide robs heat from the material to form a core substrate. Namely, when the core substrate contains hydroxide, it is thought that laser processing results improve.

A solution containing NaOH (10 g/L), $NaClO_2$ (40 g/L) and $Na_3PO_4$ (6 g/L) is applied on the surface of copper foil (20a) to conduct black-oxide treatment using a blackening bath (oxidation bath).

Figure 7B:
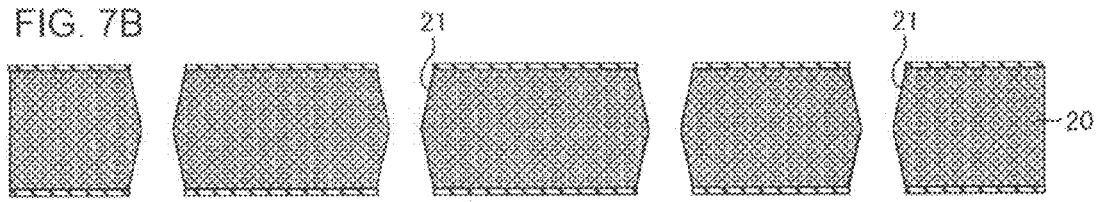
FIG. 7B is a view of a step illustrating a method for manufacturing a wiring board shown in FIG. 6.

In step (S22) of FIG. 6, a $CO_2$ laser is used to irradiate a laser from the first-surface (F) (upper-surface) side and the second-surface (S) (lower-surface) side of core substrate 20 to form penetrating holes 21 which penetrate through core substrate 20, as shown in FIG. 7B. Specifically, by irradiating a $CO_2$ laser alternately from the first-surface (F) side and the second-surface (lower-surface) (S) side of core substrate 20, holes bored from the first-surface (F) side and the second-surface (S) side are joined to form penetrating hole 21.

Desmearing is conducted on core substrate 20 by immersing it in a solution containing permanganic acid at a predetermined concentration. At that time, it is preferred to treat core substrate 20 in such a way that the amount of its weight loss is 1.0 wt. % or lower, preferably 0.5 wt. % or lower. Since core substrate 20 is formed by impregnating reinforcing material such as glass cloth with resin, glass cloth may protrude into penetrating holes when resin is dissolved during the desmearing treatment. However, if the percentage of weight loss of core substrate 20 is in such a range, protrusion of glass cloth is suppressed, thus preventing voids when plating is filled in penetrating holes. Then, a palladium catalyst is attached to the surfaces of core substrate 20.

Figure 7C:
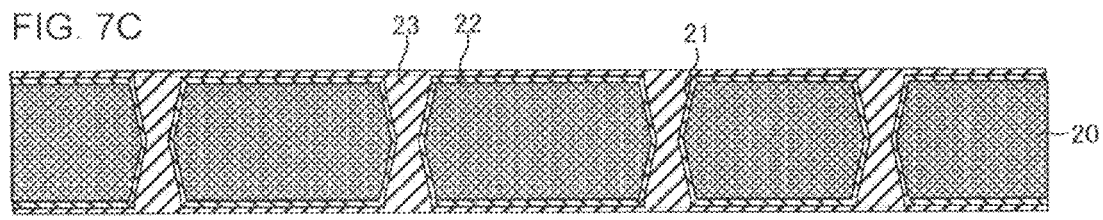
FIG. 7C is a view of a step illustrating a method for manufacturing a wiring board shown in FIG. 6.

Core substrate 20 is immersed in an electroless plating solution to form electroless plated film 22 on first surface (F) and second surface (S) of core substrate 20 and on the inner walls of penetrating holes 21 as shown in FIG. 7C. As for the material for electroless plated film 22, copper, nickel and the like are listed. Electrolytic plated film 23 is formed on electroless plated film 22 using electroless plated film 22 as a seed layer. Accordingly, penetrating holes 21 are filled with electrolytic plated film.

Figure 7D:
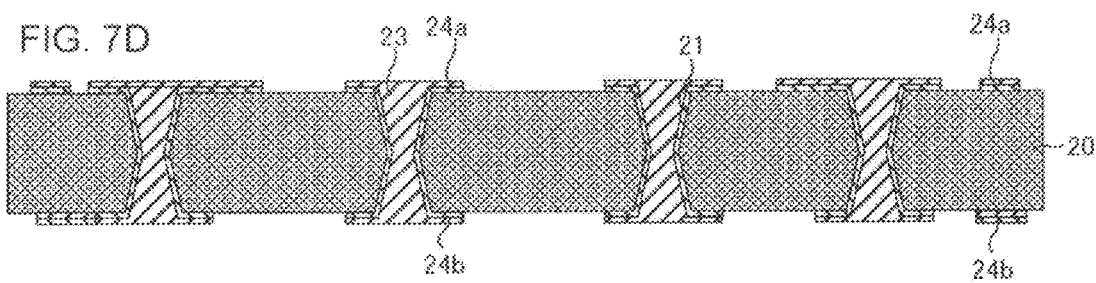
FIG. 7D is a view of a step illustrating a method for manufacturing a wiring board shown in FIG. 6.

Etching resist with a predetermined pattern is formed on electrolytic plated film 23 on substrate surfaces, and electroless plated film 22, electrolytic plated film and copper foil (20a) are removed from where no etching resist is formed, as shown in FIG. 7D. Then, the etching resist is removed to form conductive layer (24a) on first surface (F) of core substrate 20 and conductive layer (24b) on second surface (S) of core substrate 20. Conductive layer (24a) and conductive layer (24b) are connected to each other by electrolytic plated film 23 (through-hole conductor) in penetrating hole 21.

Figure 7E:
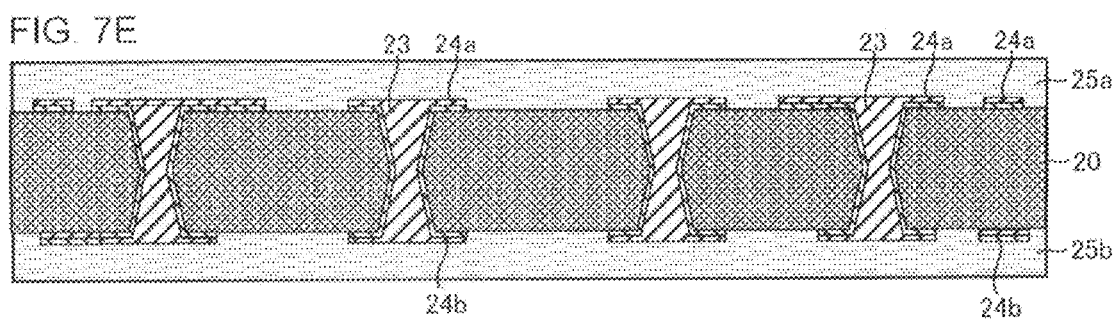
FIG. 7E is a view of a step illustrating a method for manufacturing a wiring board shown in FIG. 6.

In step (S23) of FIG. 6, interlayer insulation film (brand name ABF-45SH, made by Ajinomoto) is laminated on both surfaces (F, S) of core substrate 20 to form interlayer resin insulation layers (25a, 25b) as shown in FIG. 7E.

Figure 7F:
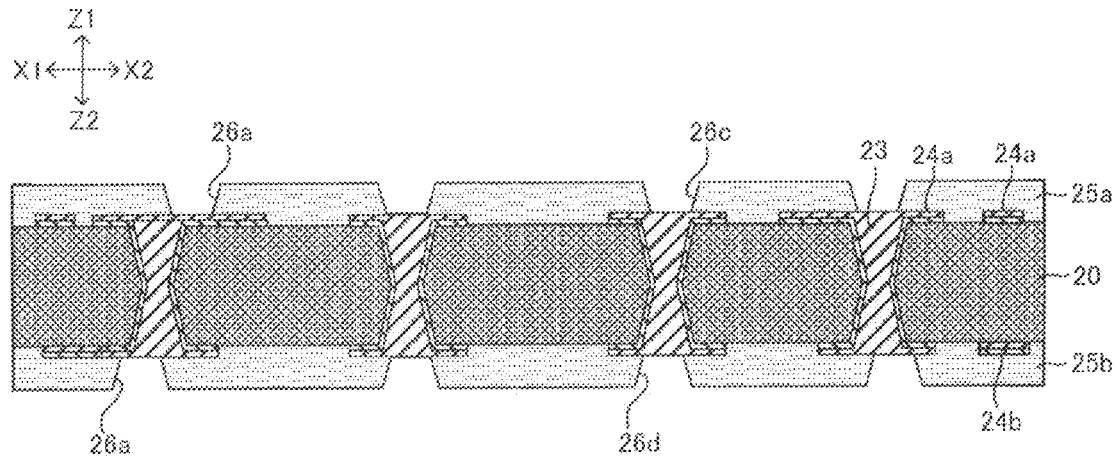
FIG. 7F is a view of a step illustrating a method for manufacturing a wiring board shown in FIG. 6.

Using a $CO_2$ gas laser, via-hole opening portions (26c, 26d) are formed respectively in interlayer resin insulation layers (25a, 25b) as shown in FIG. 7F. Then, the substrate is immersed in an oxidant such as permanganate to conduct desmearing treatment.

Figure 7G:
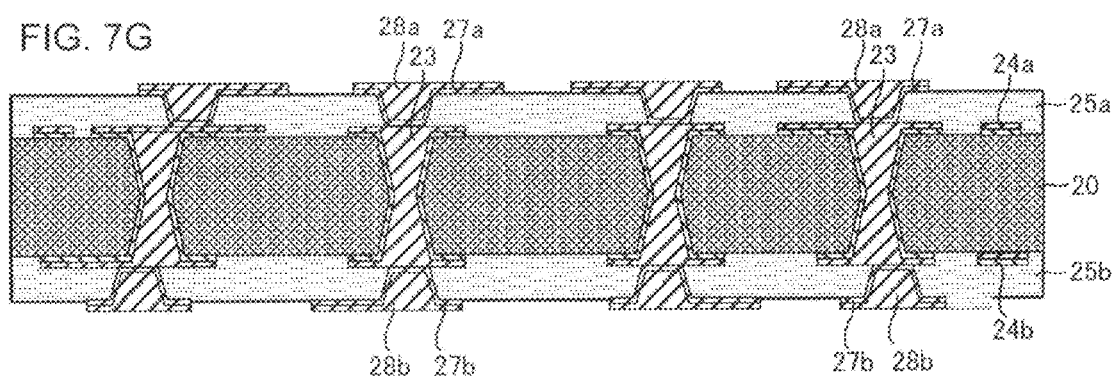
FIG. 7G is a view of a step illustrating a method for manufacturing a wiring board shown in FIG. 6.
Figure 7H:
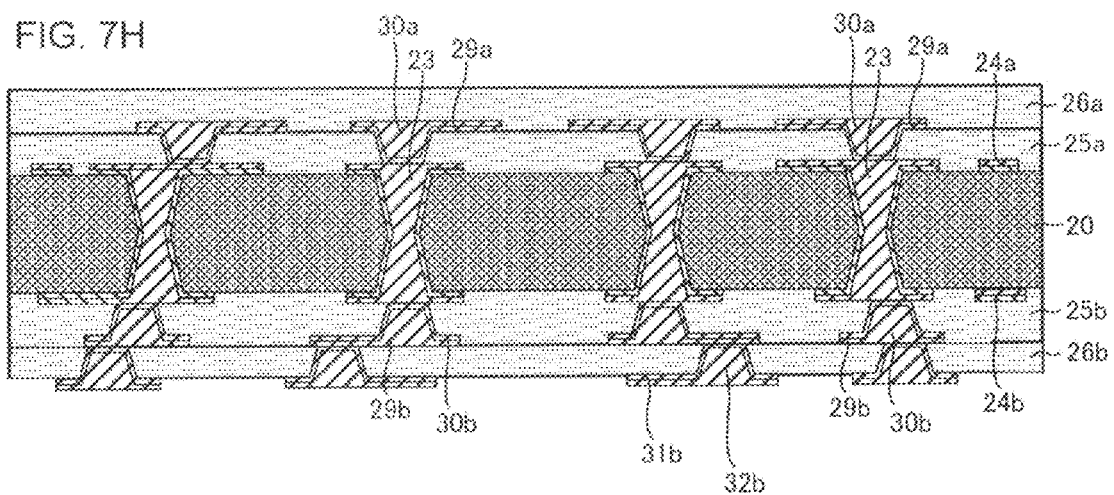
FIG. 7H is a view of a step illustrating a method for manufacturing a wiring board shown in FIG. 6.
Figure 7I:
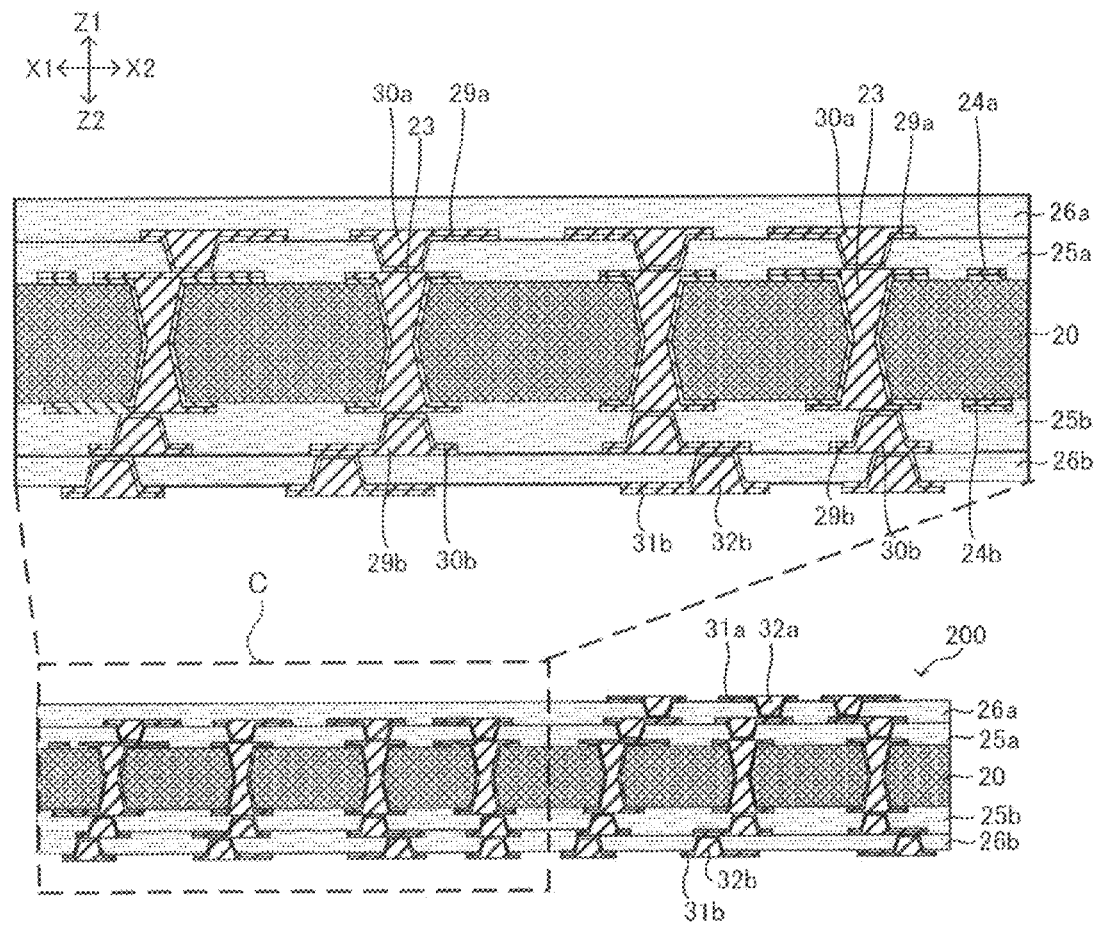
FIG. 7I is a view of a step illustrating a method for manufacturing a wiring board shown in FIG. 6 (the lower view shows an enlarged cross section of region (C), which is a main part of the upper view)

A palladium catalyst or the like is attached to surfaces of interlayer resin insulation layers (25a, 25b) and the substrate is immersed in an electroless plating solution to form electroless plated films (27a, 27b) as shown in FIG. 7G. Then, plating resist is formed on electroless plated films (27a, 27b). Electrolytic plated films (28a, 28b) are formed on portions of electroless plated films (27a, 27b) exposed from the plating resist. After that, the plating resist is removed using a solution containing monoethanolamine. By etching away electroless plated films between portions of electrolytic plated films, conductive layers (29a, 29b) and via conductors (30a, 30b) are formed. Then, Sn plating is performed on surfaces of conductive layers (29a, 29b) to form SnCu layers. A silane coupling agent is applied on the SnCu layers.

Figure 7J:
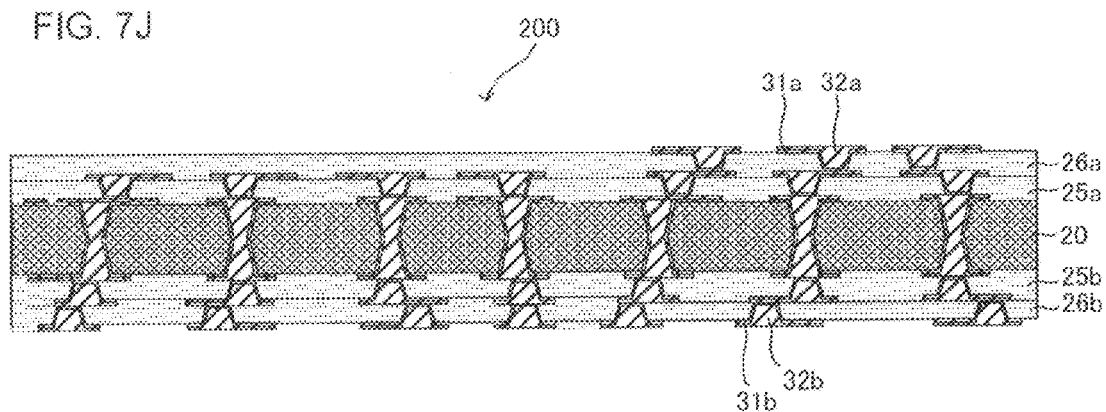
FIG. 7J is a view of a step illustrating a method for manufacturing a wiring board shown in FIG. 6.

In step (S24) of FIG. 6, the above-described steps are repeated as shown in FIGS. (7H, 7I). Accordingly, from the first-surface (F) side and second-surface (lower-surface) (S) side of core substrate 20, interlayer resin insulation layers (26a, 26b) are laminated on interlayer resin insulation layers (25a, 25b), and then conductive layers (31a, 31b) and via conductors (32a, 32b) are formed for interlayer resin insulation layers (26a, 26b) (see FIG. 7J).

Figure 7K:
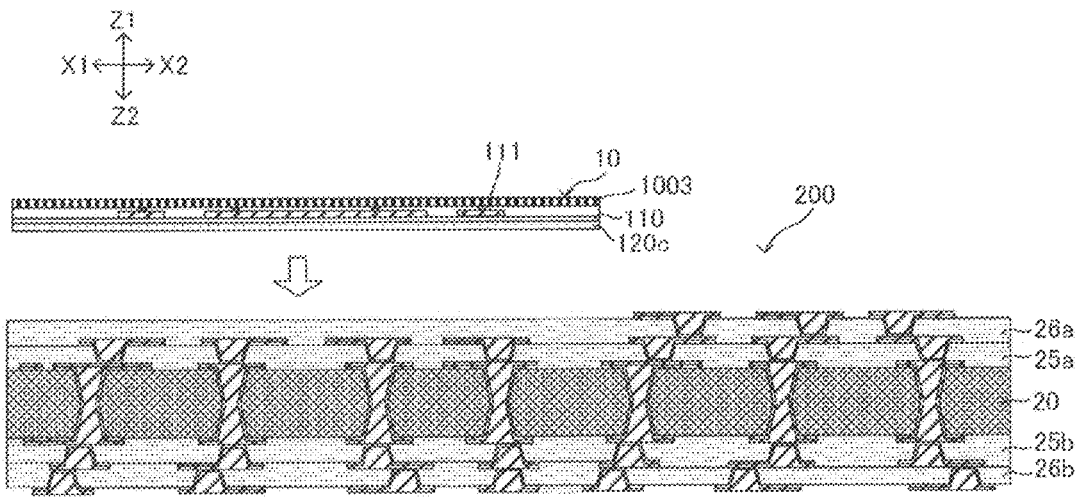
FIG. 7K is a view of a step illustrating a method for manufacturing a wiring board shown in FIG. 6.
Figure 7L:
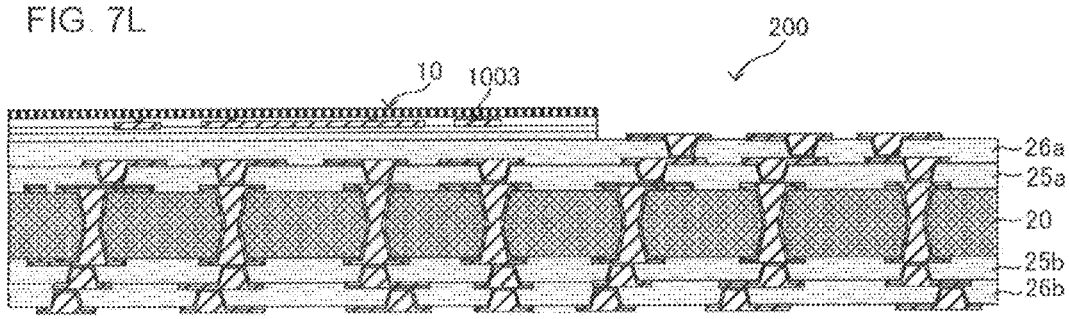
FIG. 7L is a view of a step illustrating a method for manufacturing a wiring board shown in FIG. 6.

In step (S25) of FIG. 6, wiring structure 10 is mounted on a predetermined region of interlayer resin insulation layers (26a, 26b) through adhesive layer (120c) as shown in FIG. 7K. According, the state shown in FIG. 7L is obtained.

Figure 7M:
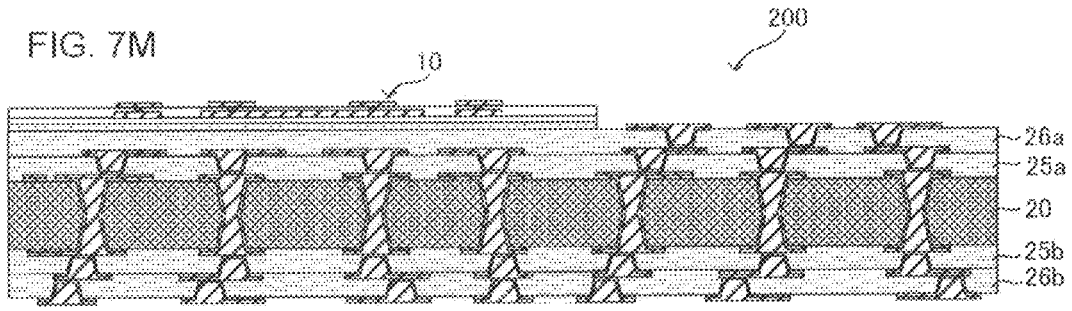
FIG. 7M is a view of a step illustrating a method for manufacturing a wiring board shown in FIG. 6.

Support sheet 1003 is removed as shown in FIG. 7M.

Figure 7N:
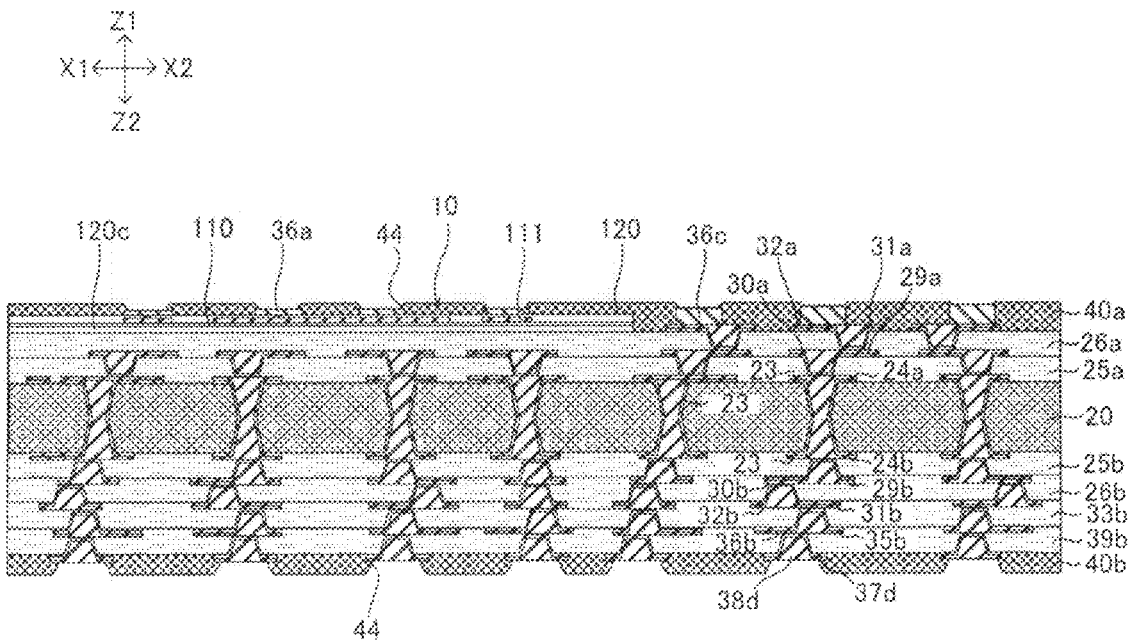
FIG. 7N is a view of a step illustrating a method for manufacturing a wiring board shown in FIG. 6.
Figure 7O:
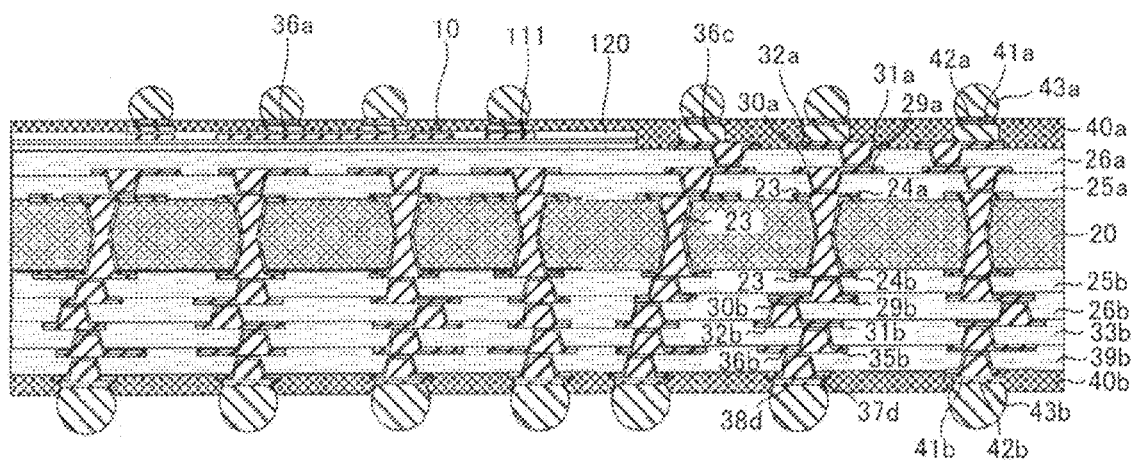
FIG. 7O is a view of a step illustrating a method for manufacturing a wiring board shown in FIG. 6.

In step (S26) of FIG. 6, interlayer resin insulation layer (39b) is laminated on interlayer resin insulation layer (33b) as shown in FIG. 7N. The above-described steps are further repeated. Accordingly, interlayer resin insulation layers (33b, 39b) are laminated on interlayer resin insulation layer (26b) from the second-surface (S) side of core substrate 20, and conductive layer (35b) and via conductors (36b) are formed for interlayer resin insulation layer (33b). Also, conductive layers (37d) and via conductors (38d) are formed for interlayer resin insulation layer (39b). Then, solder-resist layers (40a, 40b) with openings 44 are formed on both surfaces of the substrate. Here, the top surfaces of conductive layers (36a, 36c) and via conductors (38d) exposed through opening portions 44 work as solder pads.

In step (S27) of FIG. 6, nickel-plated layers (41a, 41b) are formed on solder pads, and gold-plated layers (42a, 42b) are further formed on nickel-plated layers (41a, 41b). Nickel-palladium-gold layers may also be formed instead of nickel-gold layers. Then, solder bumps are loaded in opening portions 44, and a reflow is conducted to form solder bumps (43a) on the first-surface (upper-surface) side and solder bumps (43b) on the second-surface (lower-surface) side. Accordingly, wiring board 100 is completed as a multilayer printed wiring board.

The method for manufacturing a wiring board according to the present embodiment is not limited to the embodiment described above, and it may be modified within a scope that does not deviate from the technical concept of the present invention. Modified examples of the present embodiment are described below.

MODIFIED EXAMPLE 1

Figure 8:
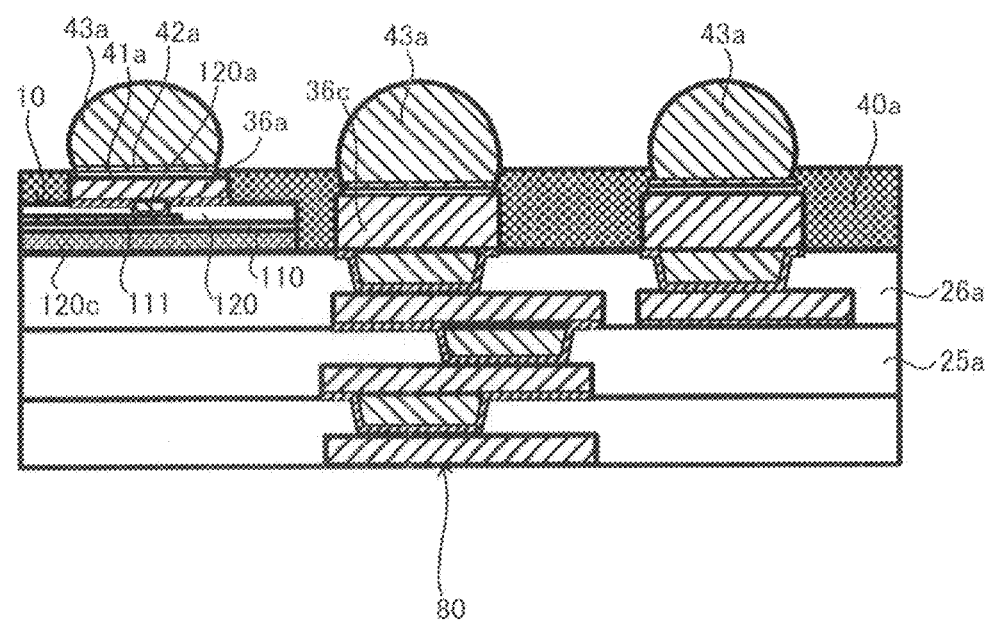
FIG. 8 is a cross-sectional view showing a main part of a wiring board according to Modified Example 1 of the first embodiment.

In the above embodiment, wiring structure 10 was positioned on first interlayer resin insulation layer (26a), which is positioned first from above, while conductive layer (36a), electrode (36c) and conductive layer (32a) are each formed in solder-resist layer (40a) positioned as an uppermost layer. However, that is not the only option. As shown in FIG. 8, only wiring structure 10 along with via conductor (36a) and electrode (36c) connected to the upper-surface side of wiring structure 10 may be formed in the same insulation layer (solder-resist layer (40a) in FIG. 8). The rest of the structure and the measurements of each element are the same as those in the above embodiment. Also, the process for manufacturing wiring board 100 is the same as the above embodiment except that wiring structure 10, along with conductive layers (36a) and electrodes (36c) connected to the upper-surface side of wiring structure 10, are formed in the same insulation layer.

MODIFIED EXAMPLE 2

Figure 9:
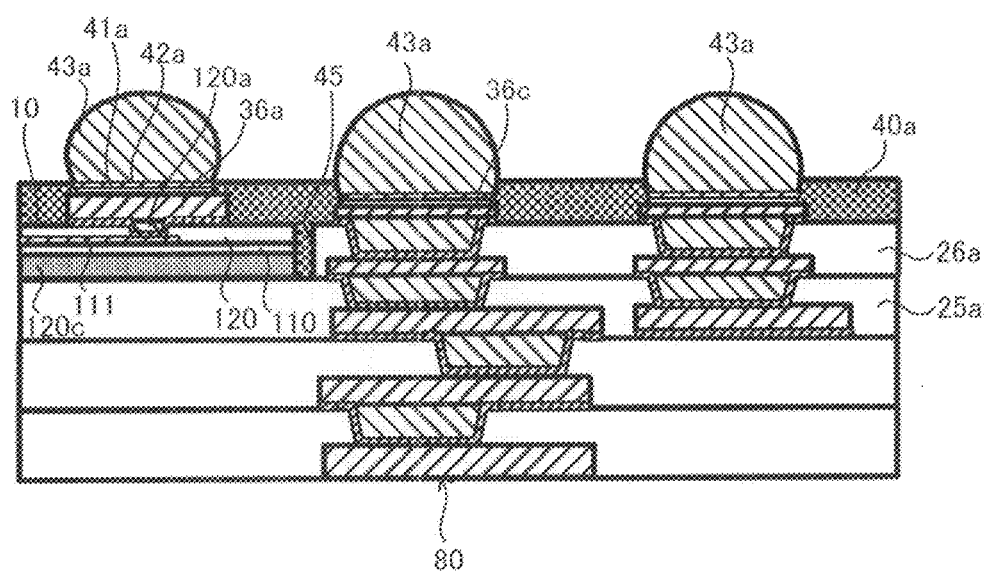
FIG. 9 is a cross-sectional view showing a main part of a wiring board according to Modified Example 2 of the first embodiment.

In the above embodiment, wiring structure 10 was formed on a surface of interlayer resin insulation layer (26a), which is positioned first from above. However, that is not the only option. As shown in FIG. 9, wiring structure 10 may be accommodated in opening portion 45 formed in interlayer resin insulation layer (26a), which is positioned first from above. In such a case, wiring structure 10 is covered by solder-resist layer (40a) filled in opening portion 45. The rest of the structure and the measurements of each element are the same as those in the above embodiment. Also, the process for manufacturing wiring board 100 is the same as the above embodiment except that wiring structure 10 is accommodated in opening portion 45 formed in interlayer resin insulation layer (26a), which is positioned first from above, and covered by solder-resist layer (40a) filled in opening portion 45.

MODIFIED EXAMPLE 3

Figure 10:
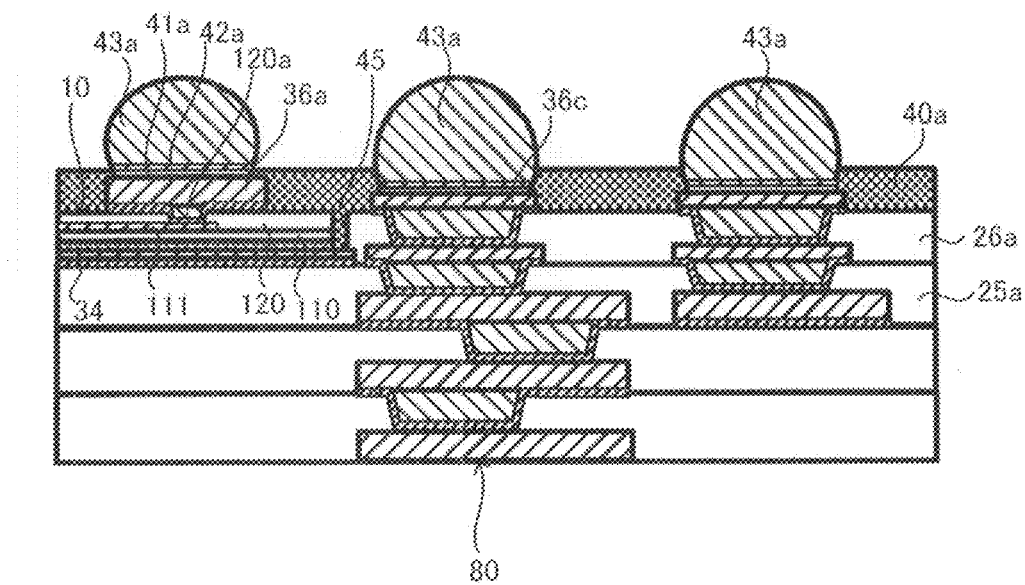
FIG. 10 is a cross-sectional view showing a main part of a wiring board according to Modified Example 3 of the first embodiment.

In the above Modified Example 2, wiring structure 10 was positioned directly on interlayer resin insulation layer (25a) inside opening portion 45 as shown in FIG. 9. However, that is not the only option, and as shown in FIG. 10, conductive plane 34 may be formed on the bottom of opening portion 45, and adhesive layer (120c) of wiring structure 10 may be adhered to the bottom of opening portion 45 which includes conductive plane 34, so that wiring structure 10 is positioned in opening portion 45. The rest of the structure and the measurements of each element are the same as those in the above embodiment. Also, the process for manufacturing wiring board 100 is the same as the above modified example 2 except that conductive plane 34 is positioned in opening portion 45 of interlayer resin insulation layer (26a), and wiring structure 10 is accommodated in opening portion 45 through conductive plane 34.

MODIFIED EXAMPLE 4

Figure 11:
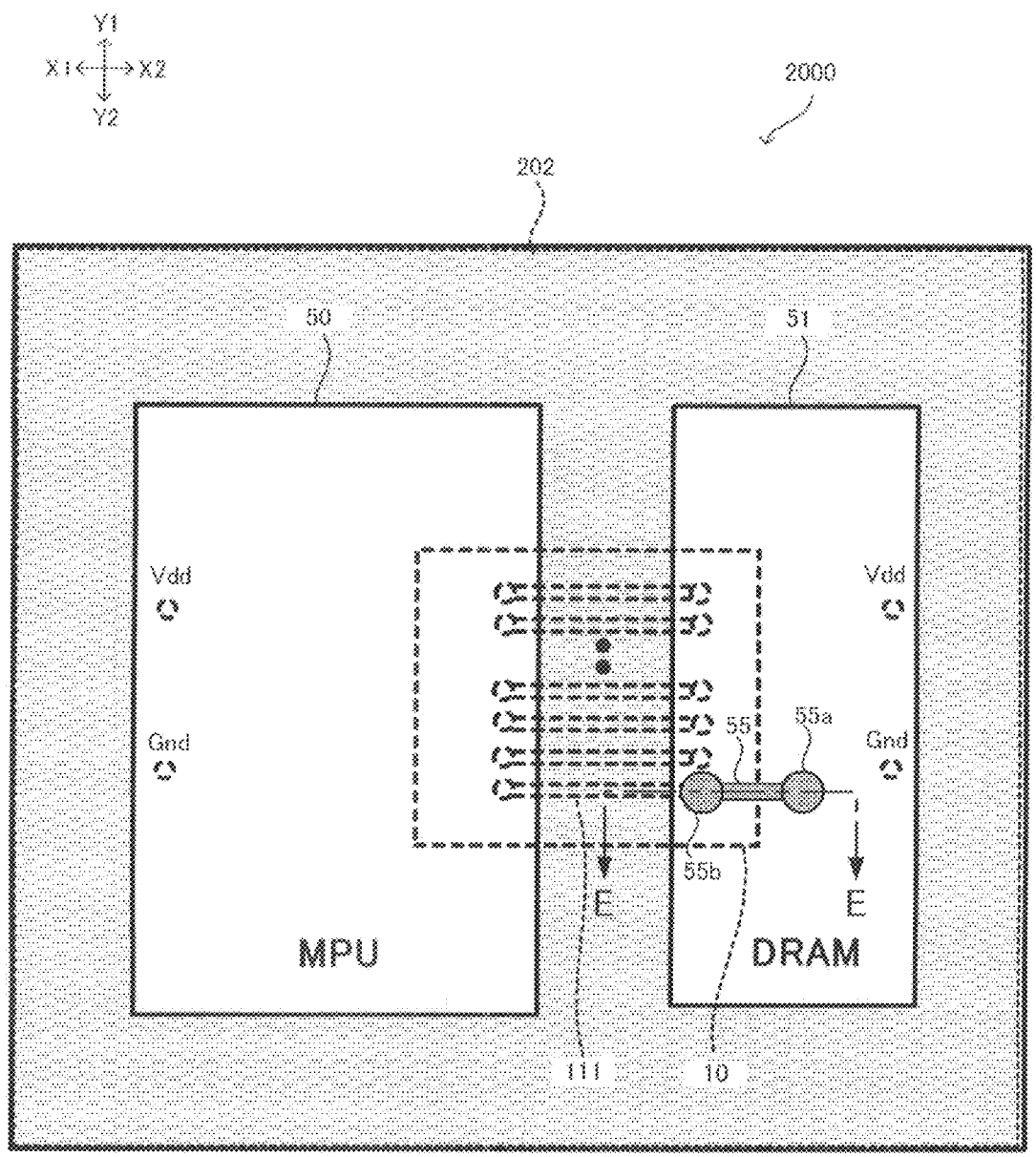
FIG. 11 is a cross-sectional view showing a main part of a wiring board according to Modified Example 4 of the first embodiment.

In Modified Example 4, main wiring board 202, wiring structure 10 in the above first embodiment, and electrical wiring 55 formed in solder-resist layer (40a) are used as shown in FIG. 11. Electrical wiring 55 electrically connects conductive layer (36a) and electrode (36c) and is used for signal transmission. No solder bump is formed on wiring structure 10, and wiring structure 10 is electrically connected to an external semiconductor chip, for example, to DRAM 51 shown in FIG. 11, through solder bump (43a) formed on electrical wiring 55. The rest of the structure and functions are the same as those in the first embodiment and its modified examples except for what is described below. By assigning the same reference numbers to the corresponding portions, their detailed descriptions are omitted below.

As shown in FIG. 11, terminal (55a) in the central portion of memory (DRAM), for example, is electrically connected to terminal (55b) on wiring structure 10 through electrical wiring 55.

MODIFIED EXAMPLE 5

Figure 12:
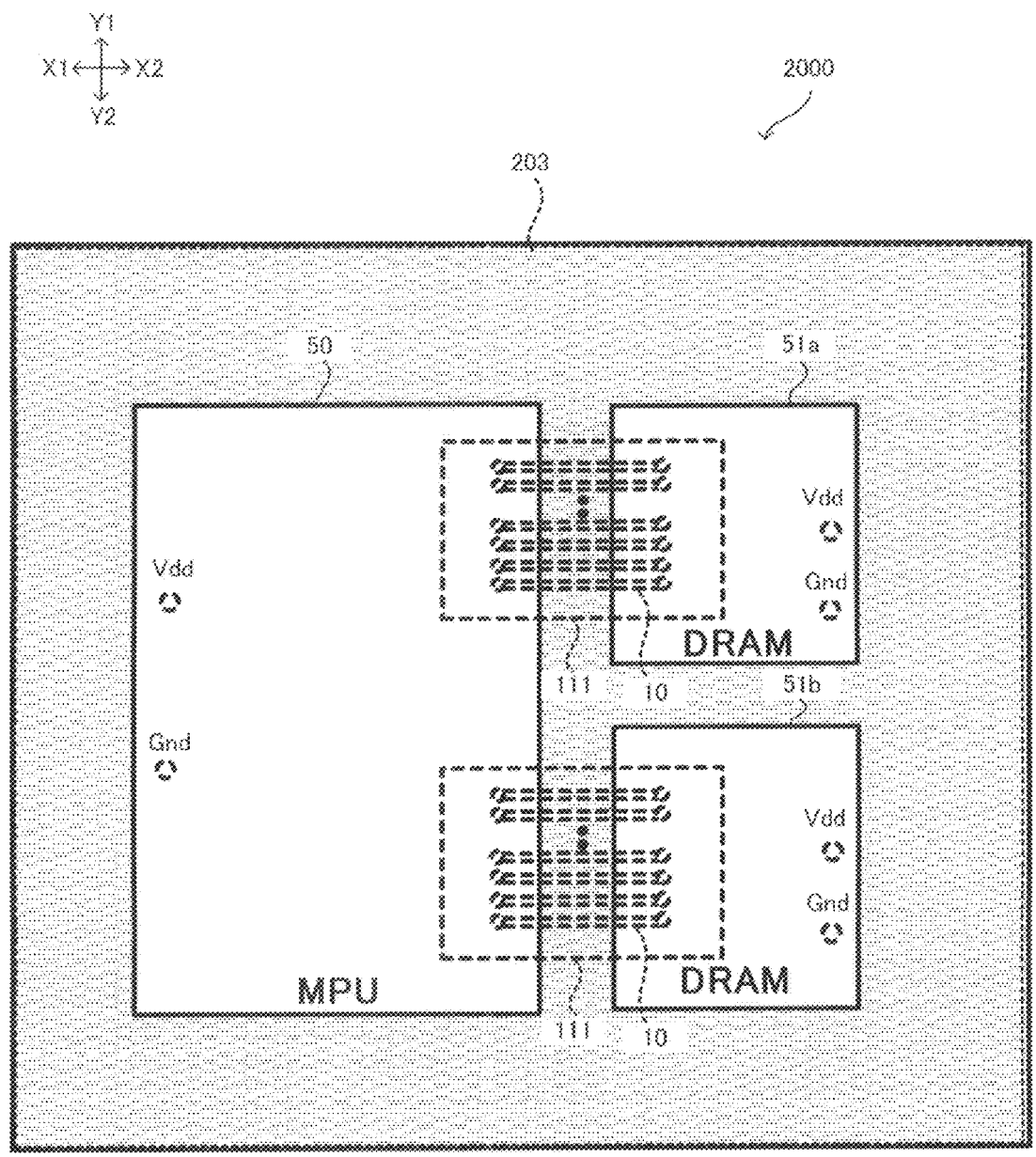
FIG. 12 is a cross-sectional view showing a main part of a wiring board according to Modified Example 5 of the first embodiment.

In Modified Example 5, two (multiple) wiring structures 10 are used in main wiring board 203 of the present embodiment as shown in FIG. 12, and MPU 50 and two DRAMs (51A, 51B) are connected by two wiring structures 10. Except for such modifications, the rest is the same as in the first embodiment and its modified examples. Thus, by assigning the same reference numbers to corresponding portions, their detailed descriptions are omitted here.

Using such connections, electrical connection reliability with MPU 50 and two DRAMs (51A, 51B) is enhanced compared with when only one wiring structure 10 is used. Namely, wiring structure 10 corresponding to characteristics of DRAMs (51A, 51B) (wiring pitch, wiring width, etc.) can be used exclusively, for example, so that accuracy in electrical connections improves. As a result, maximum performance of DRAMs (51A, 51B) connected to MPU 50 is achieved.

Second Embodiment

In the above first embodiment, wiring structure 10 was formed in one region of interlayer resin insulation layer (26a) as shown in FIGS. 1A, 1B and 3. By contrast, wiring structure 10 in a second embodiment may be formed in the entire region of interlayer resin insulation layer (26a) as shown in FIGS. 13A, 13B, 14 and 15.

Figure 13A:
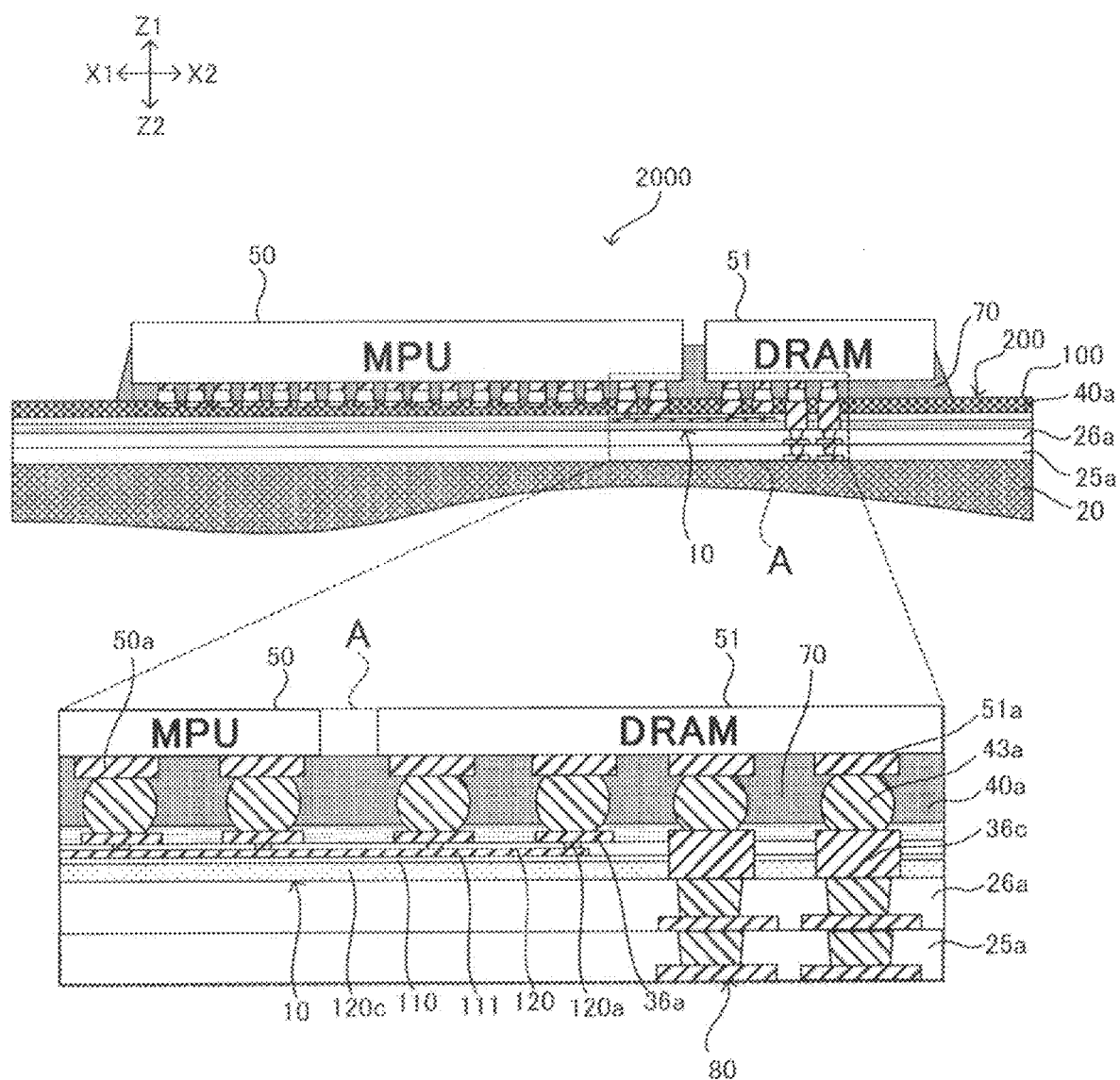
FIG. 13A is a cross-sectional view of a package substrate in which a wiring board according to a second embodiment of the present invention is used (the lower view shows an enlarged cross section of region (A), which is a main part of the upper view)
Figure 13B:
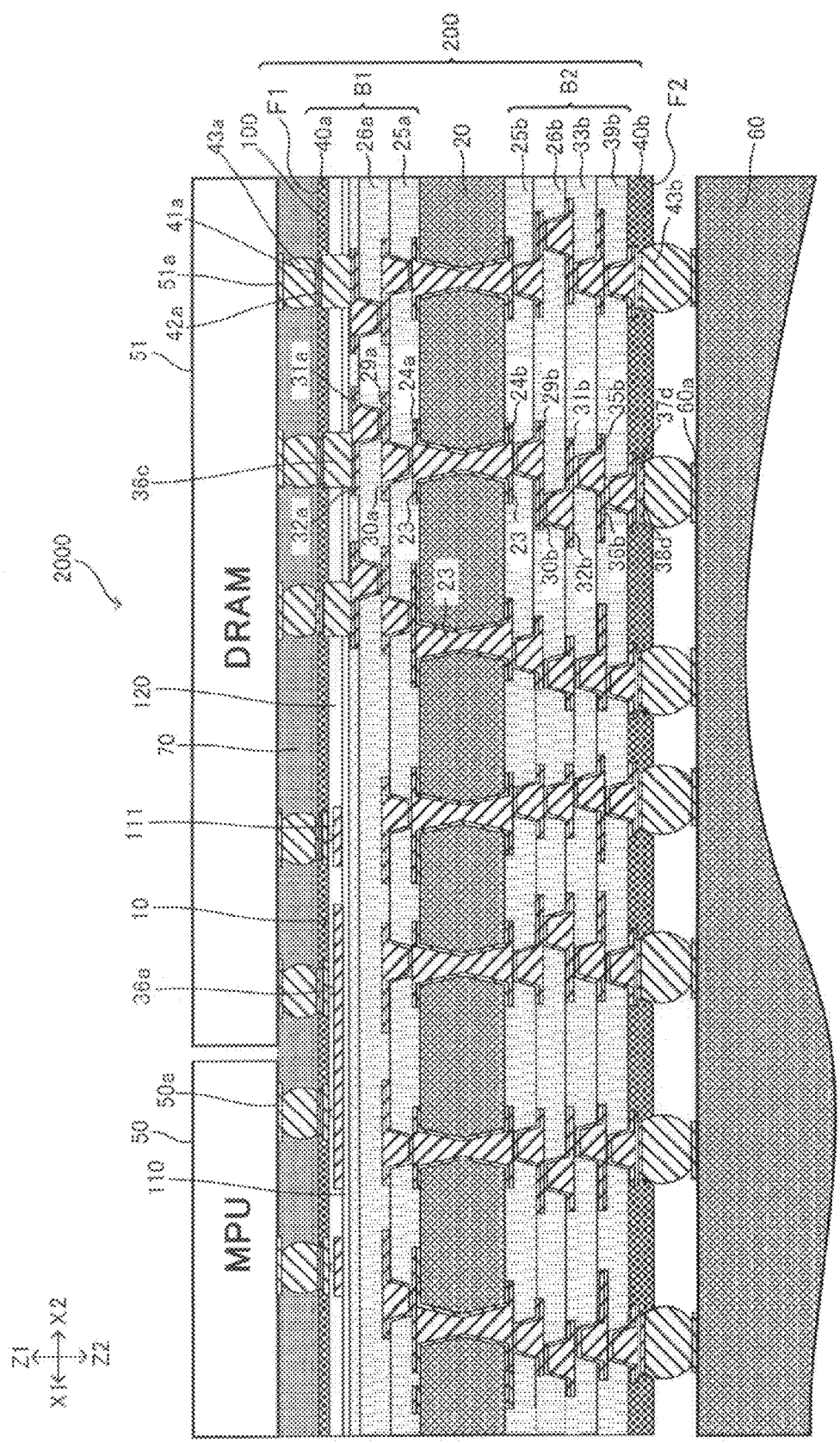
FIG. 13B is a cross-sectional view showing the details of a package substrate in which a wiring board of the second embodiment is used.
Figure 14:
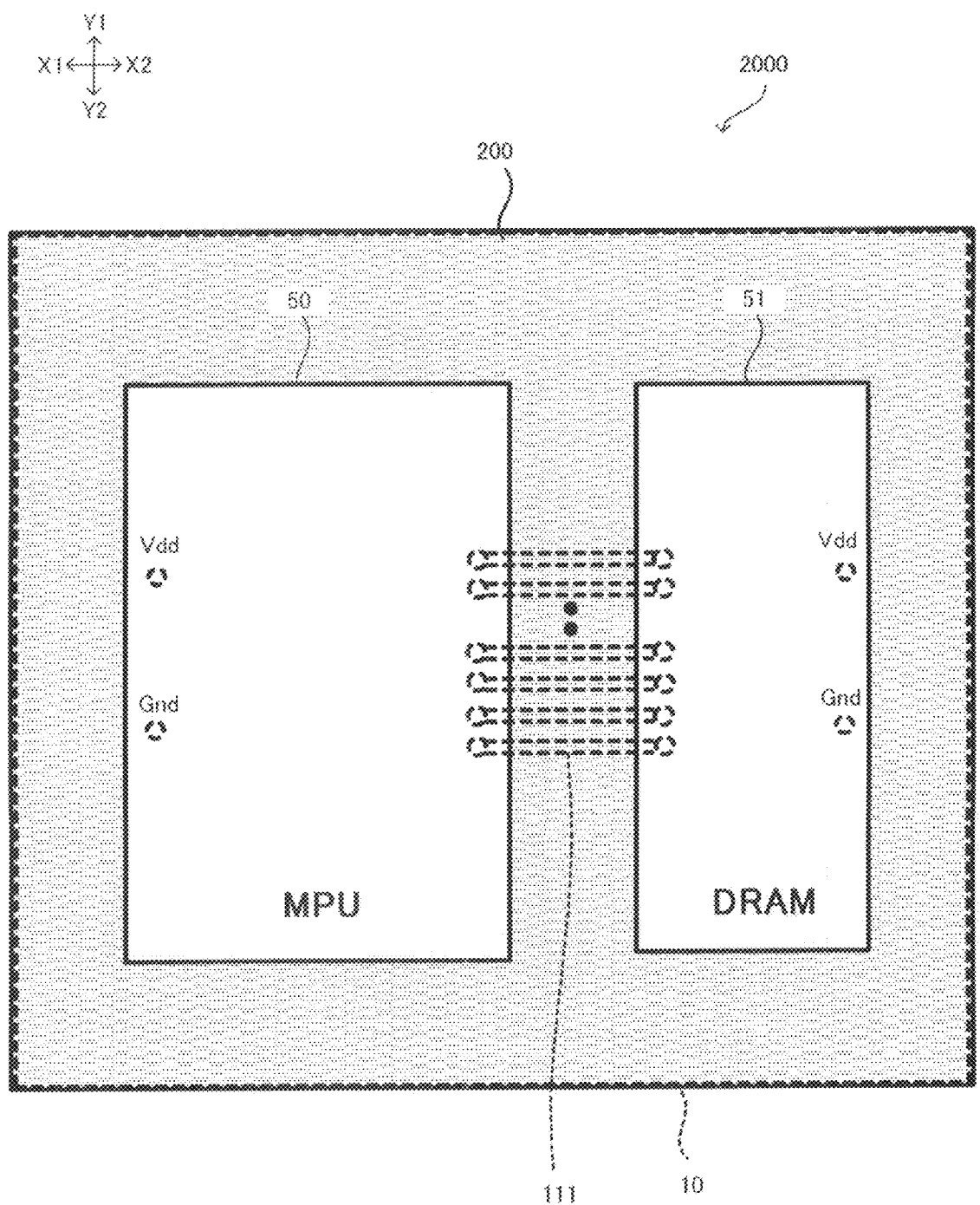
FIG. 14 is a plan view of FIG. 13A seen from direction (Z2)
Figure 15:
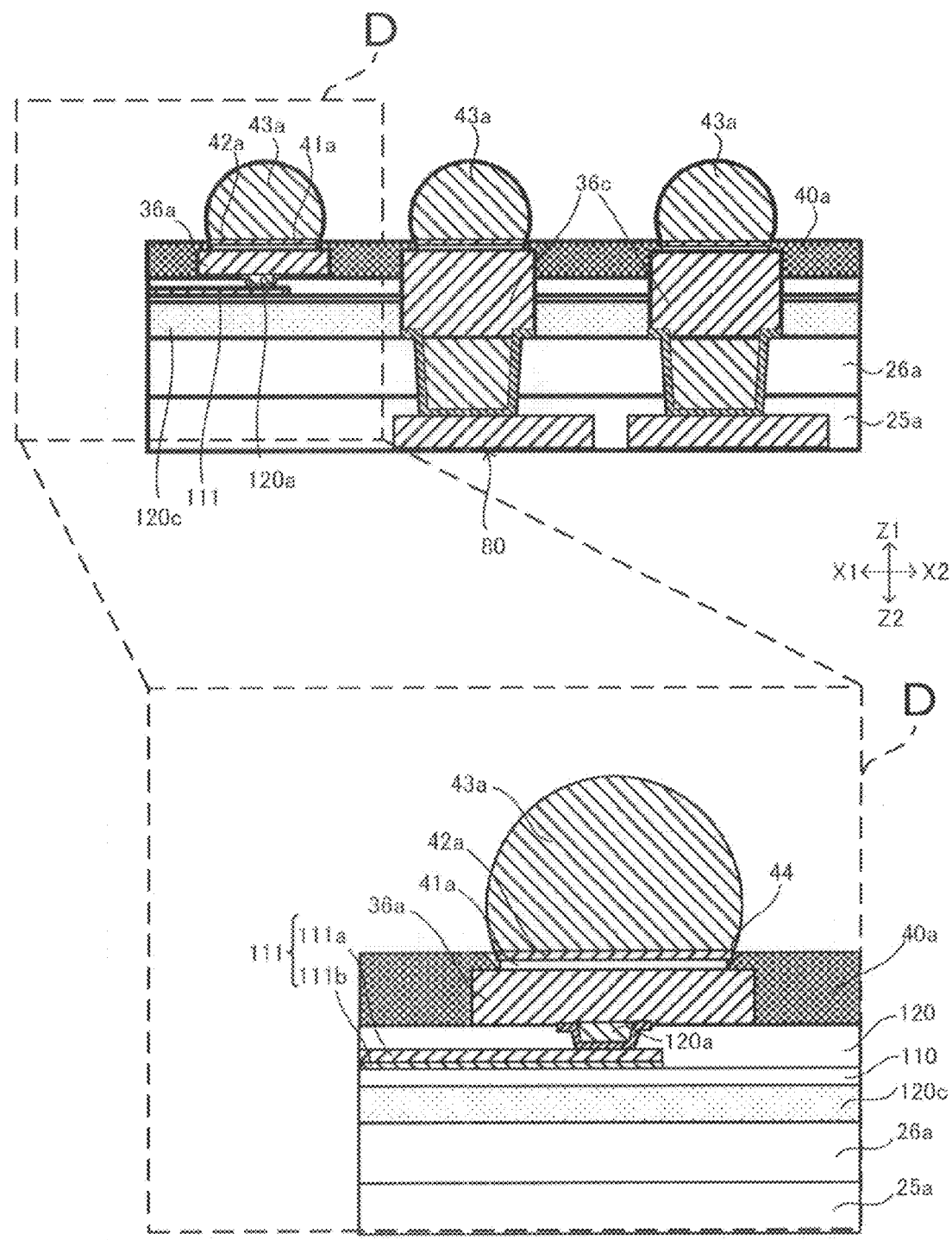
FIG. 15 is a enlarged cross-sectional view of part of FIGS. 13A and 13B, showing a main part of a wiring board of the second embodiment (the lower view shows an enlarged cross section of region (D), which is a main part of the upper view)

In the second embodiment as well, only signal transmission lines exist in wiring structure 10, and no power line is present. Power is supplied to MPU 50 and DRAM 51 through stacked vias 80 formed in main wiring board 200 as shown in FIG. 13A. Stacked vias 80 are formed to penetrate through wiring structure 10.

The rest of the structure and the measurements of each element in the second embodiment are the same as those in the above first embodiment.

The following is a description of an example of the method for manufacturing wiring board 100 of the present embodiment. The same as in the first embodiment, the process for manufacturing wiring board 100 is made up of the process for manufacturing wiring structure 10, and of the process for manufacturing main wiring board 200, which includes steps for mounting wiring structure 10 on main wiring board 200.

Process for Manufacturing Wiring Structure 10

Wiring structure 10 is manufactured by the process shown in FIG. 4, for example, the same as in the first embodiment. However, step (S16) of FIG. 4 is not conducted, and wiring structure 10 is mounted on main wiring board 200 in the state shown in FIG. 5H. In addition, support sheet 1003 is not used.

Main wiring board 200 is manufactured and wiring structure 10 is mounted on main wiring board 200. Accordingly, wiring board 100 of the present embodiment is obtained. Wiring board 100 is manufactured by a process shown in FIG. 16, for example.

Process for Manufacturing Wiring Board 100

Figure 16:
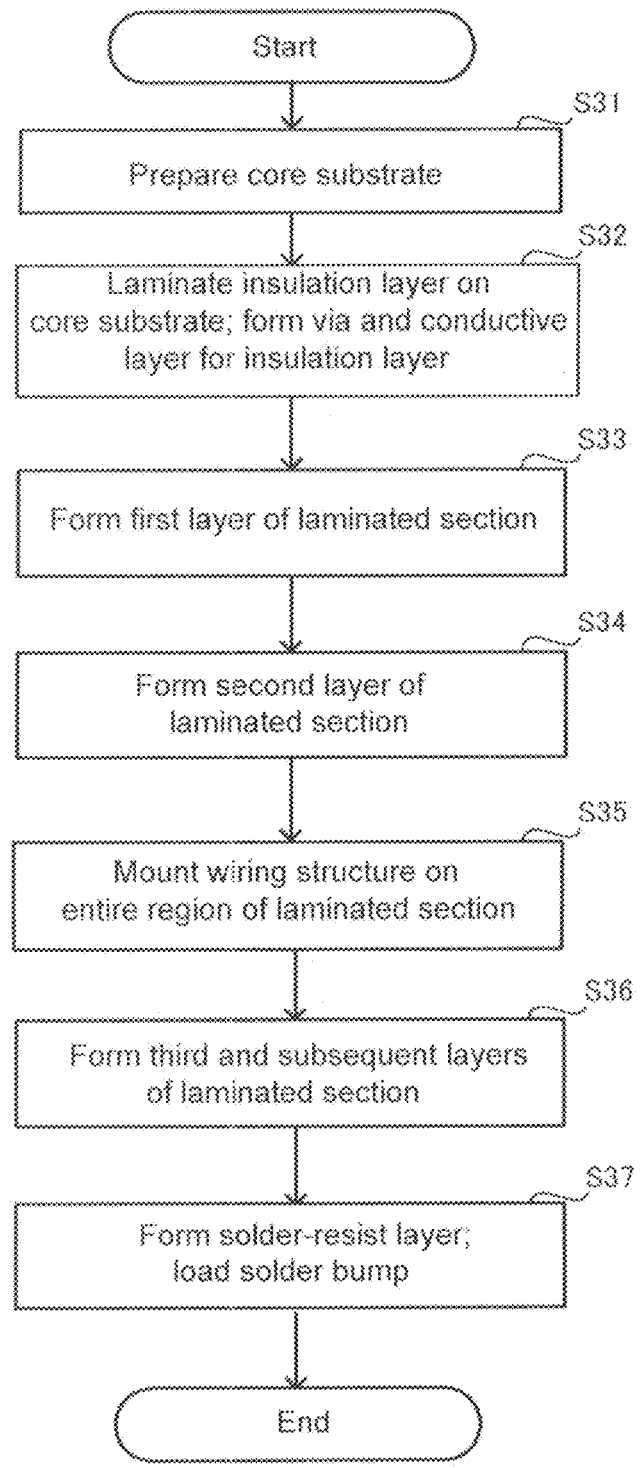
FIG. 16 is a flowchart showing a method for manufacturing a wiring board according to the second embodiment.

Wiring board 100 is manufactured by a process the same as in the first embodiment, up to step (S24) of the processing flow of the first embodiment shown in FIG. 6 (namely, up to step (S34) of the present embodiment shown in FIG. 16).

Namely, since wiring board 100 is manufactured in the same manner as shown in FIGS. 7A~7J, their descriptions are omitted here.

Figure 17A:
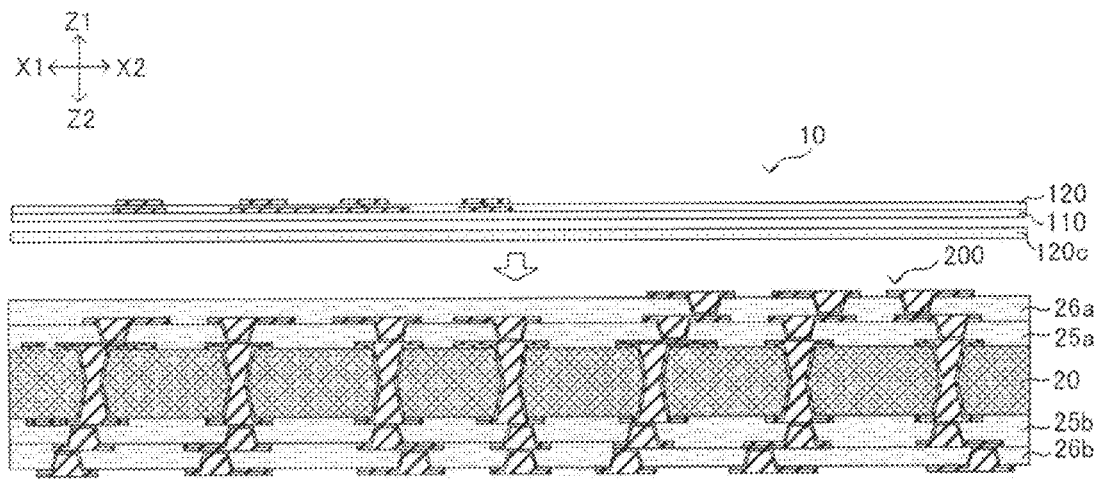
FIG. 17A is a view of a step illustrating a method for manufacturing a wiring board shown in FIG. 16.
Figure 17B:
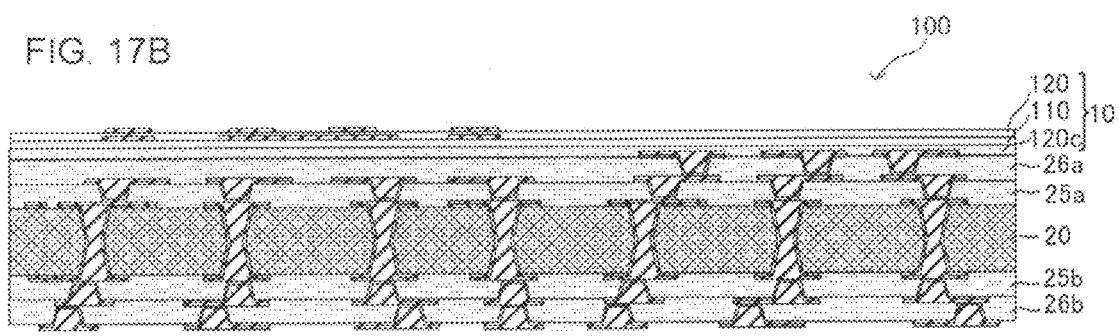
FIG. 17B is a view of a step illustrating a method for manufacturing a wiring board shown in FIG. 16.
Figure 17C:
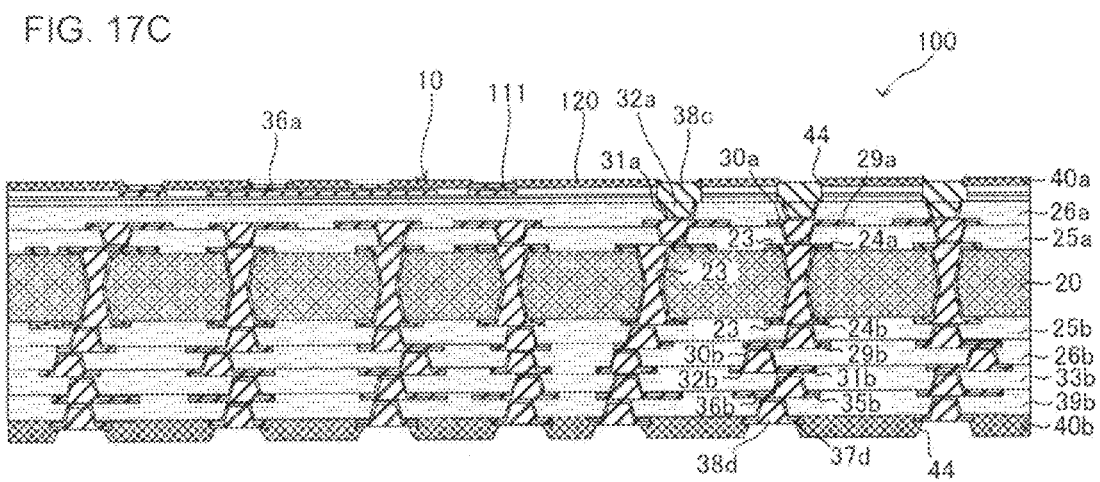
FIG. 17C is a view of a step illustrating a method for manufacturing a wiring board shown in FIG. 16.

After step (S34) of FIG. 16 (step (S24) of FIG. 6), in step (S35) of FIG. 16 wiring structure 10 (without support sheet 1003) is mounted (laminated) on the entire surface region on interlayer resin insulation layer (26a) through adhesive layer (120c) as shown in FIG. 17A. Accordingly, the state shown in FIG. 17B is obtained.

In step (S36) of FIG. 16, interlayer resin insulation layer (39b) is laminated on interlayer resin insulation layer (33b). Then, the above-described steps are repeated. Accordingly, interlayer resin insulation layers (33b, 39b) are laminated on interlayer resin insulation layer (26b) from the second-surface (S) side of core substrate 20, and conductive layers (35b) and via conductors (36b) are formed for interlayer resin insulation layer (33b). In addition, conductive layers (37d) and via conductors (38d) are formed for interlayer resin insulation layer (39b).

Then, in step (S37) of FIG. 16, solder-resist layers (40a, 40b) having opening portions 44 are formed on both surfaces of the substrate. Here, the top surfaces of conductive layers (36a, 38d) and electrodes (36c) exposed through opening portions 44 work as solder pads.

Figure 17D:
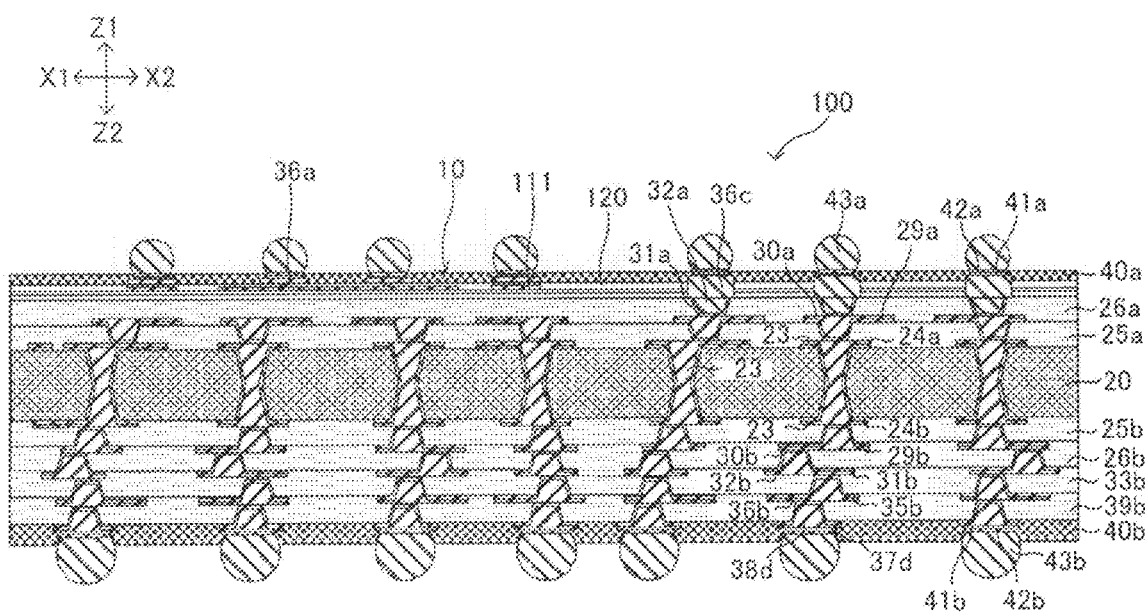
FIG. 17D is a view of a step illustrating a method for manufacturing a wiring board shown in FIG. 16.

After that, as shown in FIG. 17D, nickel-plated layers (41a, 41b) are formed on solder pads, and gold-plated layers (42a, 42b) are further formed on nickel-plated layers (41a, 41b). Nickel-palladium-gold layers may also be formed instead of nickel-gold layers. Then, solder bumps are loaded in opening portions 44 and a reflow is conducted to form solder bumps (43a) on the first-surface (upper-surface) side and solder bumps (43b) on the second-surface (lower-surface) side. Accordingly, wiring board 100 is completed as a multilayer printed wiring board.

MODIFIED EXAMPLE

Figure 18A:
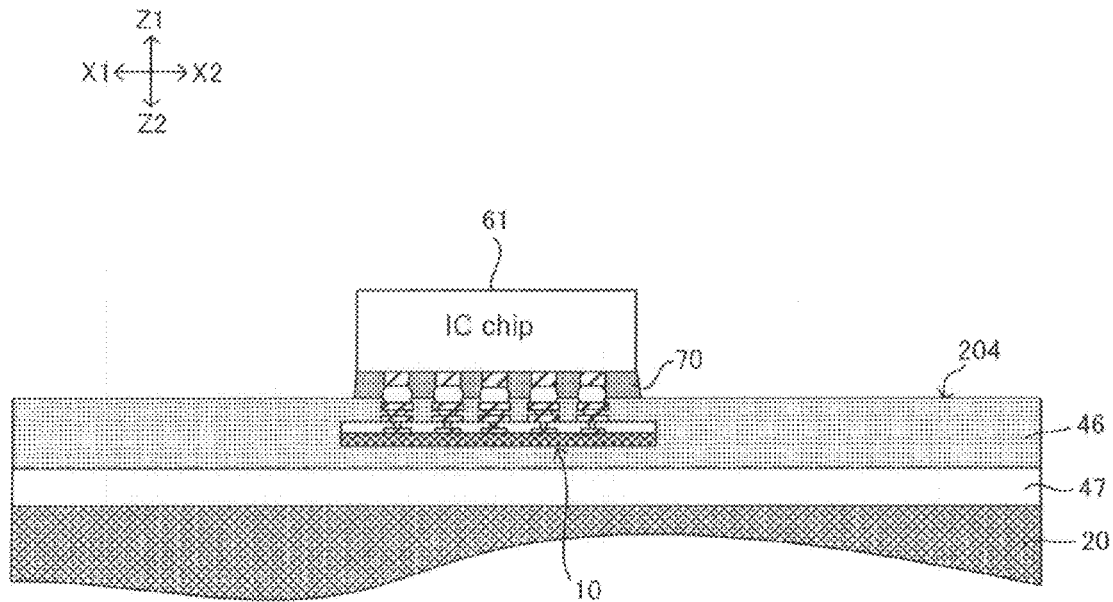
FIG. 18A is a cross-sectional view showing a main part of a wiring board according to a third embodiment.
Figure 18B:
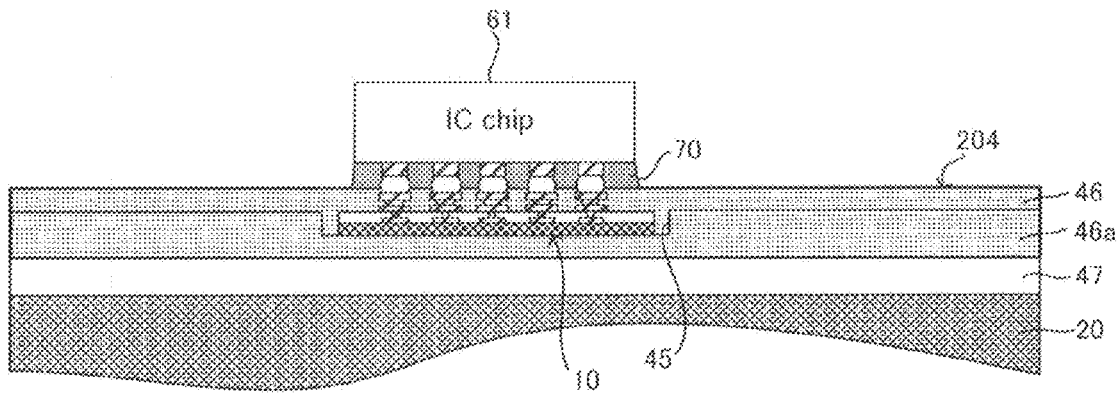
FIG. 18B is a plan view showing a main part of a wiring board according to a modified example of the third embodiment.

In the present modified example, wiring structure 10 used in the first embodiment or its modified examples is built into insulation layer 46 formed on the uppermost layer of main wiring board 204, while it is used exclusively for IC chip 61 positioned on insulation layer 46, as shown in FIGS. 18A and 18B. Here, in FIG. 18A, wiring structure 10 is built into insulation layer 46 formed on the uppermost layer of main wiring board 204, whereas in FIG. 18B, wiring structure 10 is built into insulation layer 46 while being accommodated in opening portion 45 formed in insulation layer (46a) positioned second from uppermost insulation layer 46 of main wiring board 204.

Here, main wiring board 204 has a structure in which interlayer resin insulation layer 47 and insulation layer 46 are laminated in that order on core substrate 20.

In the present embodiment, wiring structure 10 is manufactured by a process of its own, separate from main wiring board 204, and is built into main wiring board 204. Therefore, wiring structure 10 is designed and manufactured exclusively corresponding to the characteristics of IC chip 61 (wiring pitch, wiring width, etc.), and is built into main wiring board 204 to be electrically connected to IC chip 61. As a result, defects in wiring structure 10 are reduced, and the production yield of the wiring board is improved accordingly.

Furthermore, the method for manufacturing a wiring board related to the present invention is not limited to the order and contents described in each of the embodiments and modified examples. Such order and contents may be freely modified within a scope that does not deviate from the gist of the present invention. Also, any unnecessary step may be omitted depending on usage or the like.

In each of the above embodiments and modified examples, the number of conductive layers formed on the first-surface (F1) side of core substrate 20 and the number of conductive layers formed on the second-surface (F2) side of core substrate 20 are two and four respectively. However, that is not the only option, and the number of layers (the number of conductive layers) in a wiring board, to which the above-described structures are applied, is modified freely within a scope of practical use.

The process for manufacturing a wiring board related to the present invention is not limited to the order and contents shown in each of the embodiments and modified examples above. The order and contents may be modified freely within a scope that does not deviate from the gist of the present invention. Also, any unnecessary step may be omitted according to usage or the like.

Each of the above embodiments and modified examples may be combined freely. An appropriate combination may be selected according to usage or the like.

A wiring board related to one aspect of the present invention has the following: first insulation layer (26*a*); first conductive pattern (31*a*) formed on first insulation layer (26*a*); wiring structure 10 positioned on first insulation layer (26*a*) and having second insulation layer 110 and second conductive pattern 111 on second insulation layer 110; and solder-resist layer (40*a*) formed on first insulation layer (26*a*), on first conductive pattern (31*a*) and on wiring structure 10, and having opening portions 44 which open at least part of first conductive pattern (31*a*) and at least part of conductive layer (36*a*) connected to second conductive pattern 111.

The pattern width of second conductive pattern 111 is preferred to be smaller than the pattern width of first conductive pattern (31*a*).

The distance between adjacent second conductive patterns 111 is preferred to be smaller than the distance between adjacent first conductive patterns (31*a*).

The top surface of electrode (36*c*) formed on first conductive pattern (31*a*) and the top surface of conductive layer (36*a*) connected to second conductive pattern 111 are preferred to be positioned on the same plane.

Wiring structure 10 is preferred to be formed on second insulation layer 110 and to further include third insulation layer 120 covering second conductive pattern 111 and via (120*a*) connected to second conductive pattern 111.

Adhesive layer (120*c*) is preferred to be interposed between first insulation layer (26*a*) and wiring structure 10.

Electrode (36*c*) formed on first conductive pattern (31*a*) and conductive layer (36*a*) connected to second conductive pattern 111 are preferred to work as mounting pads for mounting first semiconductor element 50 and second semiconductor element 51.

The mounting pads include first pad (36*e*) connected to first semiconductor element 50 and second pad (36*f*) connected to second semiconductor element 51, and the distance between first pads (36*e*) is preferred to be smaller than the distance between second pads (36*f*).

Second conductive pattern 111 is preferred to be a signal line for connecting first semiconductor element 50 and second semiconductor element 51.

The L/S (line/space) of second conductive pattern 111 is preferred to be 1 μm/1 μm~5 μm/5 μm.

It is preferred that opening portion 45 be formed in first insulation layer (26*a*), and that wiring structure 10 be accommodated in opening portion 45.

A method for manufacturing a wiring board according to a second aspect of the present invention includes the following: forming first conductive pattern (31*a*) on first insulation layer (26*a*); on first insulation layer (26*a*), positioning wiring structure 10 having second insulation layer 110 and second conductive pattern 111 formed on second insulation layer 110; and on first insulation layer (26*a*), on first conductive pattern (31*a*) and on wiring structure 10, forming solder-resist layer (40*a*) having opening portions 44 that expose at least part of first conductive pattern (31*a*) and at least part of conductive layer (36*a*) connected to second conductive pattern 111.

It is preferred to further include forming opening portion 45 in first insulation layer (26*a*), and positioning wiring structure 10 in opening portion 45 of first insulation layer (26*a*).

According to an embodiment of the present invention, a wiring board with high reliability is provided.

Wiring boards according to the embodiments of the present invention are suitable as package substrates for mounting multiple semiconductor elements (dies). Also, manufacturing methods according to the embodiments of the present invention are suitable for manufacturing such package substrates.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
    a first insulation layer;
    a first conductive layer comprising a plurality of first conductive patterns formed on the first insulation layer;
    a wiring structure positioned on the first insulation layer and comprising a second insulation layer and a second conductive layer comprising a plurality of second conductive patterns formed on the second insulation layer;
    a plurality of conductive patterns formed on the wiring structure such that the conductive patterns are connected to the second conductive patterns, respectively;
    a plurality of first electrodes formed on the plurality of first conductive patterns, respectively; and
    a plurality of second electrodes formed on the conductive patterns connected to the second conductive patterns of the wiring structure, respectively,
    wherein the first electrodes and the second electrodes have top surfaces which form a same plane.

2. The wiring board according to claim 1, wherein the plurality of second conductive patterns has a pattern width which is set smaller than a pattern width of the plurality of first conductive patterns.

3. The wiring board according to claim 1, wherein the plurality of second conductive patterns has an adjacent distance between the second conductive patterns which is set smaller than an adjacent distance between the first conductive patterns.

4. The wiring board according to claim 2, wherein the plurality of second conductive patterns has an adjacent distance between the second conductive patterns which is set smaller than an adjacent distance between the first conductive patterns.

5. The wiring board according to claim 1, further comprising a solder-resist layer formed on the first insulation layer such that the solder-resist layer is formed on the first conductive layer, the wiring structure and the conductive patterns formed on the second conductive patterns, wherein the solder-resist layer has a plurality of opening portions exposing at least portions of the first conductive patterns, respectively, and a plurality of opening portions exposing at least portions of the conductive patterns connected to the second conductive patterns, respectively.

6. The wiring board according to claim 1, wherein the wiring structure includes a third insulation layer covering the second conductive patterns and a plurality of via structures connected to the plurality of second conductive patterns, respectively.

7. The wiring board according to claim 6, further comprising an adhesive layer interposed between the first insulation layer and the wiring structure.

8. The wiring board according to claim 1, further comprising:
   a plurality of first mounting pads formed on the plurality of first conductive patterns, respectively, such that the plurality of first mounting pads is positioned to mount a first semiconductor device; and
   a plurality of second mounting pads formed on the conductive patterns connected to the second conductive patterns, respectively, such that the plurality of second mounting pads is positioned to mount a second semiconductor device.

9. The wiring board according to claim 8, wherein the plurality of first pads and the plurality of second pads are formed such that the first pads are distanced at a pitch which is set smaller than a pitch distancing the second pads.

10. The wiring board according to claim 1, wherein the plurality of second conductive patterns forms a signal line positioned to be connected to a first semiconductor device and a second semiconductor device.

11. The wiring board according to claim 1, wherein the plurality of second conductive patterns has a L/S which is set in a range of from 1 µm/1 µm to 5 µm/5 µm.

12. The wiring board according to claim 1, wherein the first insulation layer has an opening portion accommodating the wiring structure.

13. A method for manufacturing a wiring board, comprising:
   forming a first conductive layer comprising a plurality of first conductive patterns on a first insulation layer;
   positioning on the first insulation layer a wiring structure comprising a second insulation layer and a second conductive layer comprising a plurality of second conductive patterns formed on the second insulation layer;
   forming a plurality of conductive patterns on the second conductive patterns such that the conductive patterns are connected to the second conductive patterns, respectively;
   forming a plurality of first electrodes on the plurality of first conductive patterns, respectively; and
   forming a plurality of second electrodes on the conductive patterns connected to the second conductive patterns of the wiring structure, respectively,
   wherein the plurality of first electrodes and the plurality of second electrodes are formed such that the first electrodes and the second electrodes have top surfaces which form a same plane.

14. The method for manufacturing a wiring board according to claim 13, further comprising:
   forming a solder-resist layer on the first insulation layer such that the solder-resist layer is formed on the first conductive layer, the wiring structure and the conductive patterns formed on the second conductive patterns; and
   forming in the solder-resist layer a plurality of opening portions exposing at least portions of the first conductive patterns, respectively, and a plurality of opening portions exposing at least portions of the conductive patterns connected to the second conductive patterns, respectively.

15. The method for manufacturing a wiring board according to claim 13, further comprising forming an opening portion in the first insulation layer, wherein the positioning of the wiring structure includes placing the wiring structure in the opening portion of the first insulation layer.

16. The method for manufacturing a wiring board according to claim 13, further comprising:
   forming an opening portion in the first insulation layer; and
   forming an adhesive layer on a portion of the first insulation layer in the opening portion of the first insulation layer,
   wherein the positioning of the wiring structure includes placing the wiring structure on the adhesive layer in the opening portion of the first insulation layer.

* * * * *